(12) United States Patent
Park et al.

(10) Patent No.: US 11,889,682 B2
(45) Date of Patent: Jan. 30, 2024

(54) SEMICONDUCTOR MEMORY DEVICES

(71) Applicant: Samsung Electronics Co., Ltd., Suwon-si (KR)

(72) Inventors: Taejin Park, Yongin-si (KR); Kyujin Kim, Seoul (KR); Chulkwon Park, Hwaseong-si (KR); Sunghee Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 150 days.

(21) Appl. No.: 17/373,539

(22) Filed: Jul. 12, 2021

(65) Prior Publication Data
US 2022/0189968 A1  Jun. 16, 2022

(30) Foreign Application Priority Data
Dec. 15, 2020 (KR) .................. 10-2020-0175837

(51) Int. Cl.
*H10B 12/00* (2023.01)
(52) U.S. Cl.
CPC ......... *H10B 12/50* (2023.02); *H10B 12/0335* (2023.02); *H10B 12/053* (2023.02); *H10B 12/09* (2023.02); *H10B 12/315* (2023.02); *H10B 12/34* (2023.02); *H10B 12/482* (2023.02)
(58) Field of Classification Search
CPC .. H10B 12/0335; H10B 12/053; H10B 12/09; H10B 12/315; H10B 12/34; H10B 12/482; H10B 12/488; H10B 12/50
See application file for complete search history.

(56) References Cited

U.S. PATENT DOCUMENTS

| | | |
|---|---|---|
| 7,883,836 B2 | 2/2011 | Koo |
| 8,173,987 B2 | 5/2012 | Lung |
| 8,829,646 B2 | 9/2014 | Lung et al. |
| | (Continued) | |

FOREIGN PATENT DOCUMENTS

| | | |
|---|---|---|
| KR | 10-2017-0010498 A | 2/2017 |
| TW | 200401293 A | 1/2004 |
| | (Continued) | |

OTHER PUBLICATIONS

Taiwanese Office Action dated Nov. 17, 2022 issued in Taiwanese Patent Application No. 110137262.

*Primary Examiner* — Meiya Li
(74) *Attorney, Agent, or Firm* — Harness, Dickey & Pierce, P.L.C.

(57) ABSTRACT

A semiconductor memory device includes a substrate comprising a memory cell region and a dummy cell region surrounding the memory cell region, the memory cell region including a plurality of memory cells, a plurality of active regions in the memory cell region, each of the plurality of active regions extending in a long axis direction, the long axis direction being a diagonal direction with respect to a first horizontal direction and a second horizontal direction orthogonal to the first horizontal direction, each of the plurality of active regions having a first width in a short axis direction orthogonal to the long axis direction, and a plurality of dummy active regions in the dummy cell region, each extending in the long axis direction, each of the plurality of dummy active regions having a second width greater than the first width in the short axis direction.

20 Claims, 37 Drawing Sheets

(56) References Cited

U.S. PATENT DOCUMENTS

| | | |
|---|---|---|
| 9,634,012 B2 | 4/2017 | Park et al. |
| 9,659,951 B1 | 5/2017 | Kim |
| 10,522,550 B2 | 12/2019 | Lee et al. |
| 10,818,324 B2 | 10/2020 | Castro et al. |
| 2006/0145192 A1 | 7/2006 | Van Duuren et al. |
| 2010/0299646 A1 | 11/2010 | Pierrat |
| 2012/0171867 A1 | 7/2012 | Kim |
| 2013/0316537 A1 | 11/2013 | Chen et al. |
| 2016/0233297 A1* | 8/2016 | Tomoyama ........... H01L 21/762 |
| 2017/0077175 A1 | 3/2017 | Ueda |
| 2018/0182722 A1 | 6/2018 | Kim et al. |
| 2018/0240805 A1 | 8/2018 | Yun et al. |
| 2019/0207157 A1 | 7/2019 | Gong et al. |

FOREIGN PATENT DOCUMENTS

| | | |
|---|---|---|
| TW | 201039409 A | 11/2010 |
| TW | 201039476 A | 11/2010 |
| TW | 201209827 A | 3/2012 |
| TW | 201729352 A | 8/2017 |
| TW | 202029190 A | 8/2020 |

* cited by examiner

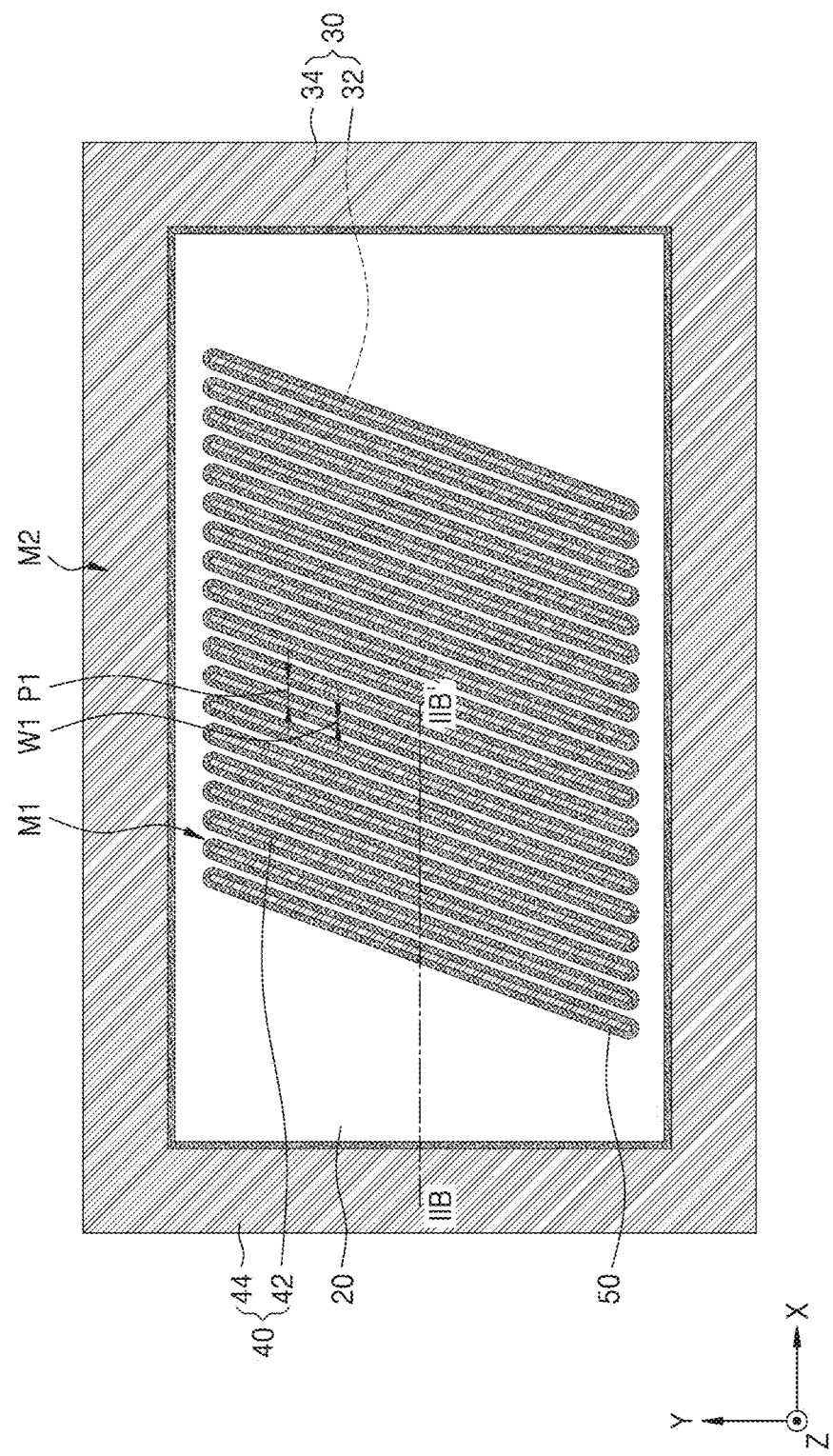

SEMICONDUCTOR MEMORY DEVICES

CROSS-REFERENCE TO RELATED APPLICATION

This application is based on and claims priority under 35 U.S.C. § 119 to Korean Patent Application No. 10-2020-0175837, filed on Dec. 15, 2020, in the Korean Intellectual Property Office, the disclosure of which is incorporated by reference herein in its entirety.

BACKGROUND

Inventive concepts relate to a semiconductor memory device, and more particularly, to a semiconductor memory device having a memory cell region and a peripheral region.

Electronic devices are reducing in size, e.g. are becoming more miniaturized and/or lightweight according to the rapid development in an electronic industry and a user's requirement thereof. Accordingly, the high degree of integration is used for the semiconductor memory device to be used in the electronic device, so that design rule for configuration of the semiconductor memory device is reduced to achieve fine structuring.

SUMMARY

Inventive concepts provide semiconductor memory devices capable of securing reliability.

In order to achieve the semiconductor memory devices, inventive concepts provides the following semiconductor memory devices.

According to some example embodiments of inventive concepts, there is provided a semiconductor memory device including a substrate comprising a memory cell region and a dummy cell region surrounding the memory cell region, the memory cell region including a plurality of memory cells, a plurality of active regions in the memory cell region, each of the plurality of active regions extending in a long axis direction, the long axis direction being a diagonal direction with respect to a first horizontal direction and a second horizontal direction orthogonal to the first horizontal direction, each of the plurality of active regions having a first width in a short axis direction orthogonal to the long axis direction, and a plurality of dummy active regions in the dummy cell region, each of the plurality of dummy active regions extending in the long axis direction, each of the plurality of dummy active regions having a second width greater than the first width in the short axis direction.

According to some example embodiments of inventive concepts, there is provided a semiconductor memory device including a substrate comprising a memory cell region, a peripheral region and a dummy cell region between the memory cell region and the peripheral region, the memory cell region including a plurality of memory cells, the dummy cell region including a plurality of dummy memory cells, a plurality of active regions in the memory cell region, each of the plurality of active regions extending in a long axis direction, the long direction a diagonal direction with respect to a first horizontal direction and a second horizontal direction orthogonal to the first horizontal direction, each of the plurality of active regions having a first width in a short axis direction and a first pitch in the short axis direction, the short axis direction orthogonal to the long axis direction, at least one logic active region in the peripheral region, and a plurality of dummy active regions in the dummy cell region, each of the plurality of dummy active regions extending in the long axis direction, each of the plurality of dummy active regions having a second width greater than the first width and a second pitch twice the first pitch, the second width and the second pitch in the short axis direction. At least one of the plurality of dummy active regions defines a plurality of sidewall recesses on sidewalls of the at least one of the plurality of dummy active regions.

According to some example embodiments of inventive concepts, there is provided a semiconductor memory device including a substrate comprising a memory cell region, a peripheral region, and a dummy cell region between the memory cell region and the peripheral region, a plurality of active regions in the memory cell region, each of the plurality of active regions extending in a long axis direction, the long axis direction being a diagonal direction with respect to a first horizontal direction and a second horizontal direction orthogonal to the first horizontal direction, each of the plurality of active regions having a first width and a first pitch, the first width and the first pitch in a short axis direction orthogonal to the long axis direction, at least one logic active region disposed in the peripheral region, a plurality of dummy active regions in the dummy cell region, each of the plurality of dummy active regions extending in the long axis direction, each of the plurality of dummy active regions having a second width greater than the first width and a second pitch greater than the first pitch, the first width and the second width in the short axis direction, a device isolation structure defining the plurality of active regions, the at least one logic active region, and the plurality of dummy active regions, a plurality of word lines extending parallel to each other in the first horizontal direction across the plurality of active regions and the plurality of dummy active regions, a plurality of bit lines that extending parallel to each other in the second horizontal direction, the plurality of bit lines on the substrate, a plurality of buried contacts filling a lower portion of a space between the plurality of bit lines on the substrate, a plurality of landing pads filling an upper portion of the space between the plurality of bit lines and extending onto the plurality of bit lines, and a plurality of capacitors connected to the plurality of landing pads. At least one of the plurality of dummy active regions defines a plurality of sidewall recesses filled with the device isolation structure on sidewalls of the at least one of the plurality of dummy active regions.

BRIEF DESCRIPTION OF THE DRAWINGS

Embodiments of inventive concepts will be more clearly understood from the following detailed description taken in conjunction with the accompanying drawings in which:

FIGS. 1A, 2A, 3A, 4A, 5A, 6A, 7A, and 8A are plan views sequentially illustrating a manufacturing method of a substrate having an active region for manufacturing/fabricating a semiconductor memory device according to some example embodiments of inventive concepts.

DETAILED DESCRIPTION OF SOME EXAMPLE EMBODIMENTS

FIGS. 1A, 2A, 3A, 4A, 5A, 6A, 7A, and 8A are plan views sequentially illustrating a manufacturing method of a substrate having an active region for fabricating a semiconductor memory device according to some example embodiments of inventive concepts, and FIGS. 1B, 2B, 3B, 4B, 5B, 6B, and 8B are cross-sectional views sequentially illustrating the fabricating method of the substrate having the active region for manufacturing the semiconductor memory device according to some example embodiments of inventive concepts. Specifically, FIGS. 1B, 2B, 3B, 4B, 5B, 6B, 7B, and 8B are cross-sectional views respectively taken along lines IB-IB' of FIG. 1A, IIB-IIB' of FIG. 2A, IIIB-IIIB' of FIG. 3A, IVB-IVB' of FIG. 4A, V-V' of FIG. 5A, VI-VI' of FIG. 6A, VIIB-VIIB' of FIG. 7A, and VIIIB-VIIIB' of FIG. 8A.

Figure 1A:
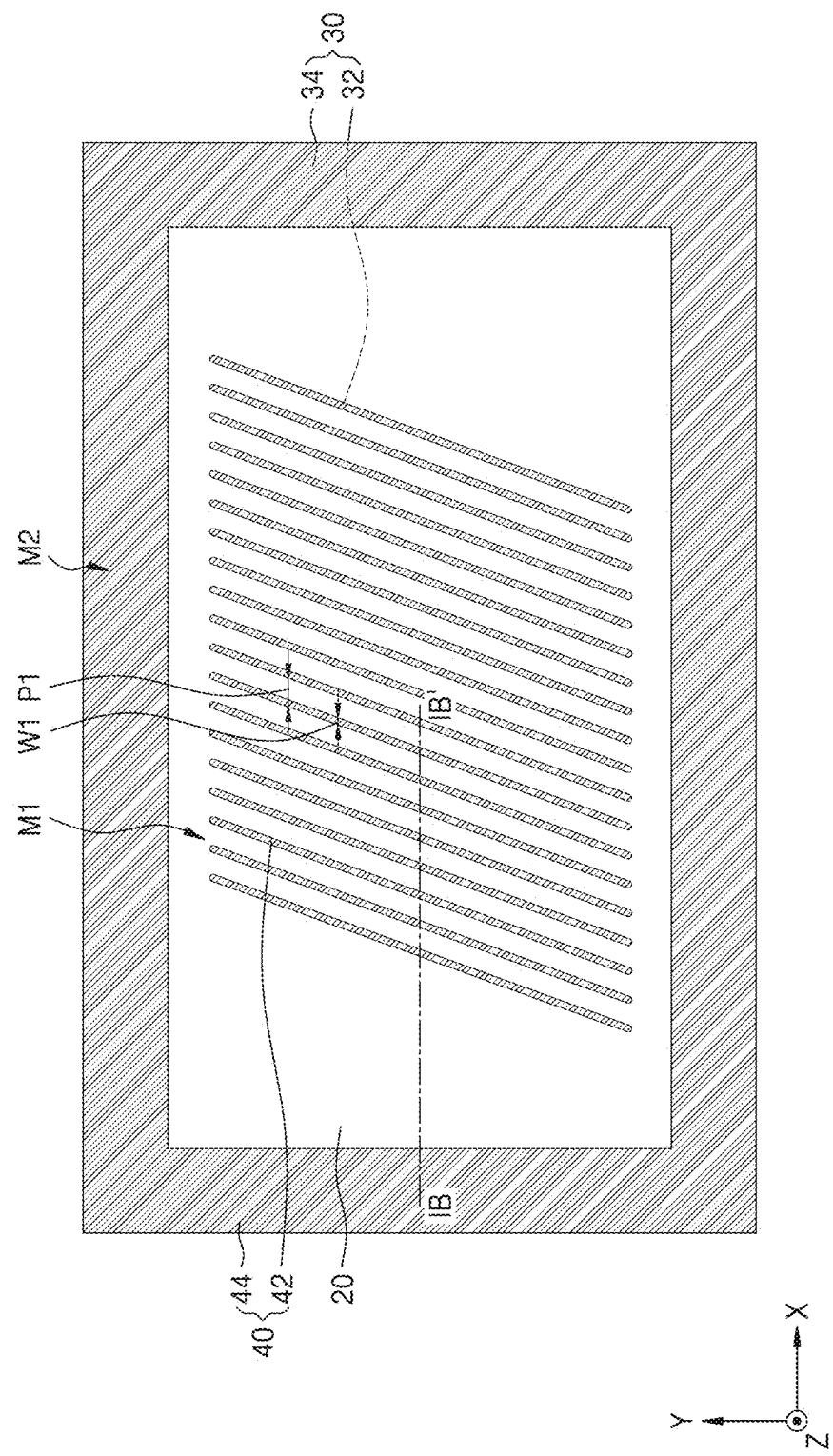
Figure 1B:
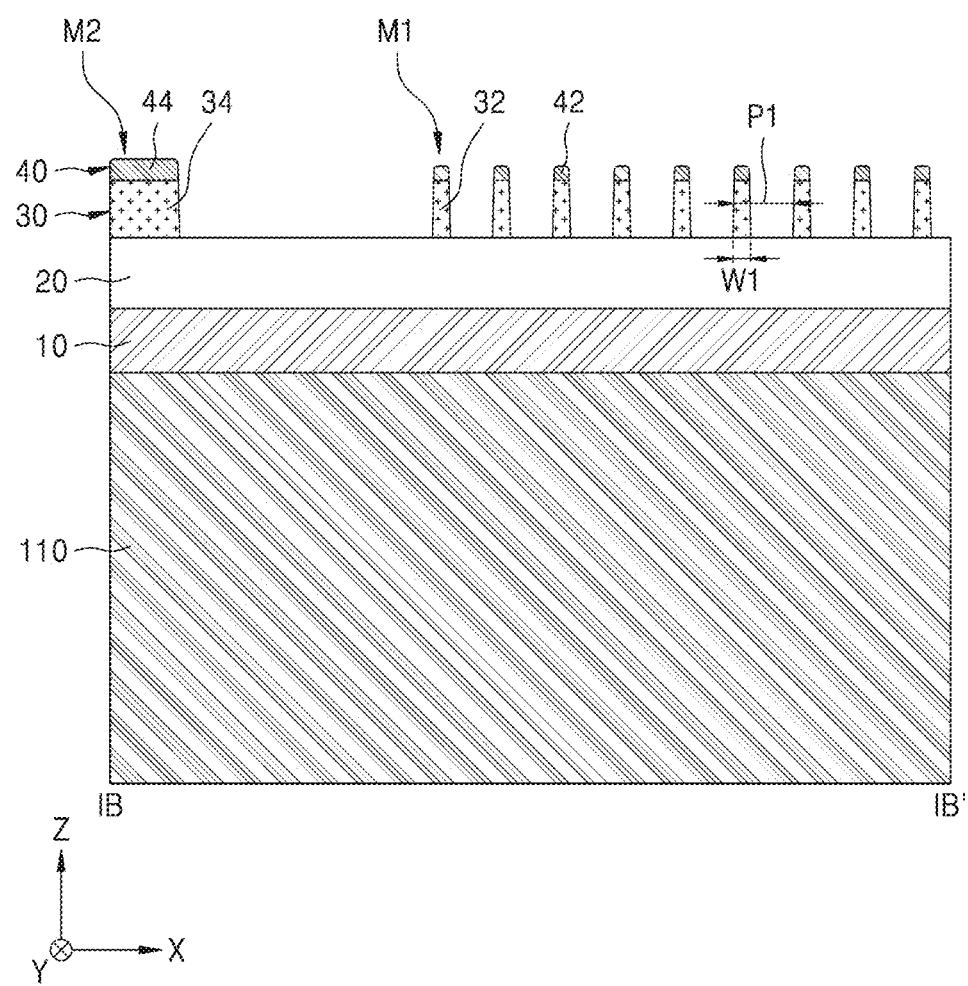
FIGS. 1B, 2B, 3B, 4B, 5B, 6B, and 8B are cross-sectional views sequentially illustrating the manufacturing method of the substrate having the active region for manufacturing the semiconductor memory device according to some example embodiments of inventive concepts.

Referring to FIGS. 1A and 1B together, a buffer layer 10, a hard mask layer 20, a first preliminary mask layer, and a second preliminary mask layer are sequentially stacked on a substrate 110, and then the first preliminary mask layer and the second preliminary mask layer are patterned to form a first mask layer 30 and a second mask layer 40. The first mask layer 30 may include a plurality of first base mask patterns 32 and at least one first peripheral mask pattern 34, and the second mask layer 40 may include a plurality of second base mask pattern 42 and at least one second peripheral mask pattern 44.

The second preliminary mask layer may be formed to be thicker than the second mask layer 40. In a process of patterning the first preliminary mask layer and the second preliminary mask layer, a portion of an upper side of the second preliminary mask layer may be lost (e.g. may be etched), and thus the second mask layer 40 may be thinner than the second preliminary mask layer.

The plurality of first base mask patterns 32 and the plurality of second base mask patterns 42 on the plurality of first base mask patterns 32 may constitute/correspond to a plurality of first base structures M1. The at least one first peripheral mask pattern 34 and the at least one second peripheral mask pattern 44 on the at least one first peripheral mask pattern 34 may constitute/correspond to at least one second base structure M2.

FIG. 1A illustrates that each of the plurality of first base structures M1 has the same length and the plurality of first base structures M1 are placed in a parallelogram region in a plan view, but example embodiments are not limited to thereto. For example, some of the plurality of first base structures M1 may have the same length and the remainder may have different lengths, and thus the plurality of first base structures M1 may be placed in a rectangle region in the plan view.

The substrate 110 may include, for example, silicon (Si), crystalline Si, polycrystalline Si, or amorphous Si, and may be doped, e.g. lightly doped, or may be undoped. In some example embodiments, the substrate 110 may include a semiconductor element such as germanium (GE), or at least one compound semiconductor selected from among silicon germanium (SiGe), silicon carbide (SiC), gallium arsenide (GaAs), indium arsenide (InAs), and indium phosphide (InP). In some example embodiments, the substrate 110 may include a silicon on insulator (SOI) structure. For example, the substrate 110 may include a buried oxide (BOX) layer. The substrate 110 may include a conductive region, for example, a well doped with impurities, or a structure doped with impurities.

The buffer layer 10 may be or may include, for example, silicon oxide. The hard mask layer 20 may include, for example, semiconductor material. In some example embodiments, the hard mask layer 20 may include polysilicon, e.g. doped or undoped polysilicon. The first mask layer 30 may include, for example, carbon-containing material. In some example embodiments, the first mask layer 30 may include an amorphous carbon layer (ACL) and/or a carbon based spin-on hardmask (C-SOH). The second mask layer 40 may include, for example, silicon nitride. In some example embodiments, at least one of the buffer layer 10 and the hard mask layer 20 may be omitted, e.g. may not be deposited or formed.

The first base mask pattern 32 and the second base mask pattern 42 constituting each of the plurality of first base structures M1 may have a relatively long island shape with a short axis and a long axis within one plane, e.g. within a plane parallel to a top surface of the substrate 110. In some example embodiments, the first base mask pattern 32 and the second base mask pattern 42 constituting each of the plurality of first base structures M1 may be arranged to have the long axis in a diagonal direction with respect to a first horizontal direction (an X direction) and a second horizontal direction (a Y direction) orthogonal to the first horizontal direction (the X direction). An angle between the X direction and the long axis direction may not be 45 degrees; for example, the angle may be between 45 degrees and 90 degrees such as 70 degrees; however, example embodiments are not limited thereto.

The plurality of first base structures M1 may extend parallel to each other in the diagonal direction with respect to the first horizontal direction (the X direction) and the second horizontal direction (the Y direction). The plurality of first base structures M1 may have a first width W1, and may be arranged at a first pitch P1, in the first horizontal direction (the X direction) or in a short axis direction. The first pitch P1 may have a value of at least 2 times the first width W1. In some example embodiments, the first pitch P1 may be about 0.2 μm to about 2 μm. In some example embodiments, the first pitch P1 may have a value of about 4 times the first width W1. In some example embodiments, the first pitch P1 may have a value of about an integer times the first width W1; however, example embodiments are not limited thereto.

FIGS. 1A and 1B shows that the plurality of first base structures M1 are surrounded by one second base structure M2, but is for examples only, and a plurality of second base structures M2 to be spaced apart from each other may be disposed around the plurality of first base structures M1. In some example embodiments, at least one second base structure M2 may have a rectangular shape in a planar, but is not limited thereto, and may have various planar shapes.

In some example embodiments, in a process of forming the plurality of first base structures M1 and at least one second base structure M2 by patterning the first preliminary mask layer and the second preliminary mask layer, the amount of loss (e.g. the amount of etching loss) of the second preliminary mask layer on the first base mask pattern 32 may be greater than the amount of loss (e.g. the amount of etching loss) of the second preliminary mask layer on the first peripheral mask pattern 34, and therefore, the thickness of the at least one second peripheral mask pattern 44 may be greater than the thickness of each of the plurality of second base mask patterns 42. There may be a difference according to loading effects or neighborhood effects between the first base structures M1 and the at least one second base structure M2.

Figure 2B:
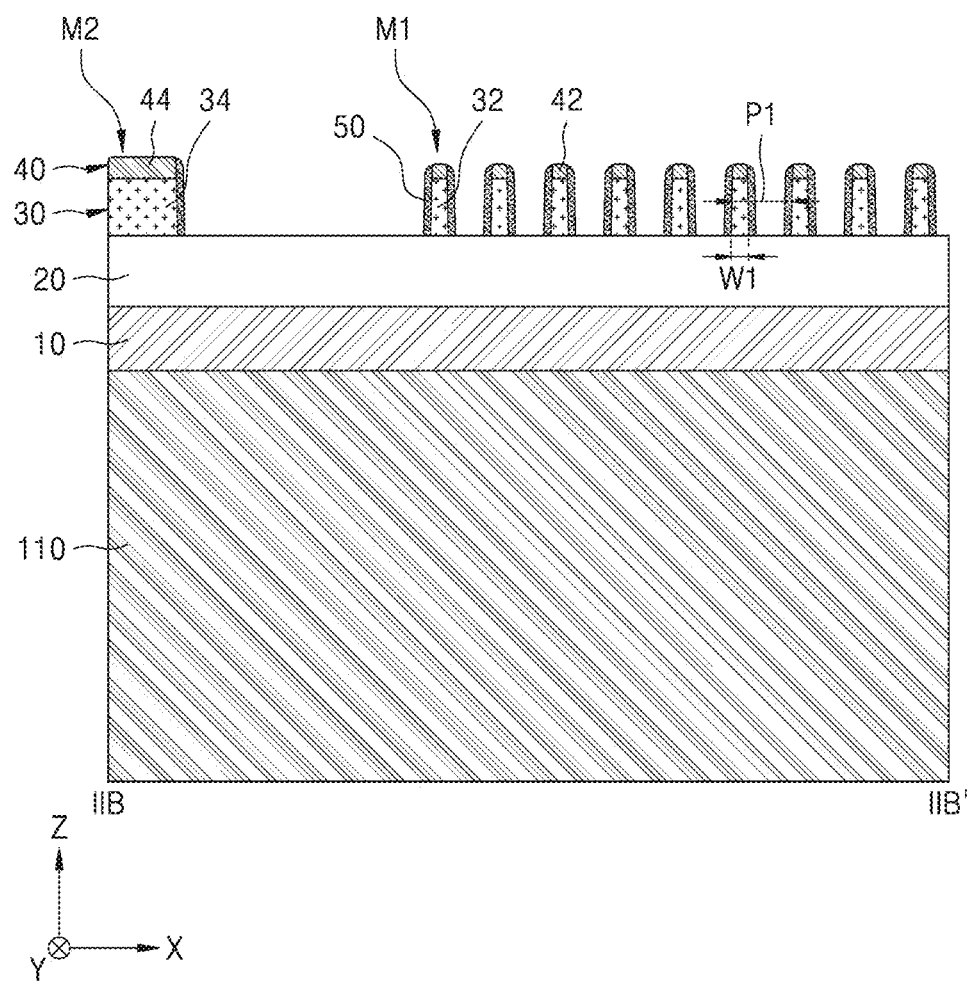

Referring to FIGS. 2A and 2B together, a plurality of spacer patterns 50 that cover sidewalls of the plurality of first base structures M1 and the at least one second base structure M2 may be formed, e.g. may be formed with an atomic layer deposition (ALD) process. The spacer pattern 50 may include, for example, silicon oxide. The plurality of spacer patterns 50 may be formed by forming a spacer material layer that conformally cover the substrate 110 on which the plurality of first base structures M1 and the second base structure M2 are formed and then removing (e.g. etching) portions of the spacer material layer that cover an upper surface of the hard mask layer 20 and an upper surface of the second mask layer 40.

In some example embodiments, the spacer material layer may have a thickness similar to or equal to the first width W1 and may be formed to conformally cover the substrate 110 on which the plurality of first base structures M1 and the second base structure M2 are formed. For example, the spacer pattern 50 may be formed to have the thickness similar to or equal to the first width W1 for the sidewalls of the plurality of first base structures M1 and the at least one second base structure M1.

Figure 3A:
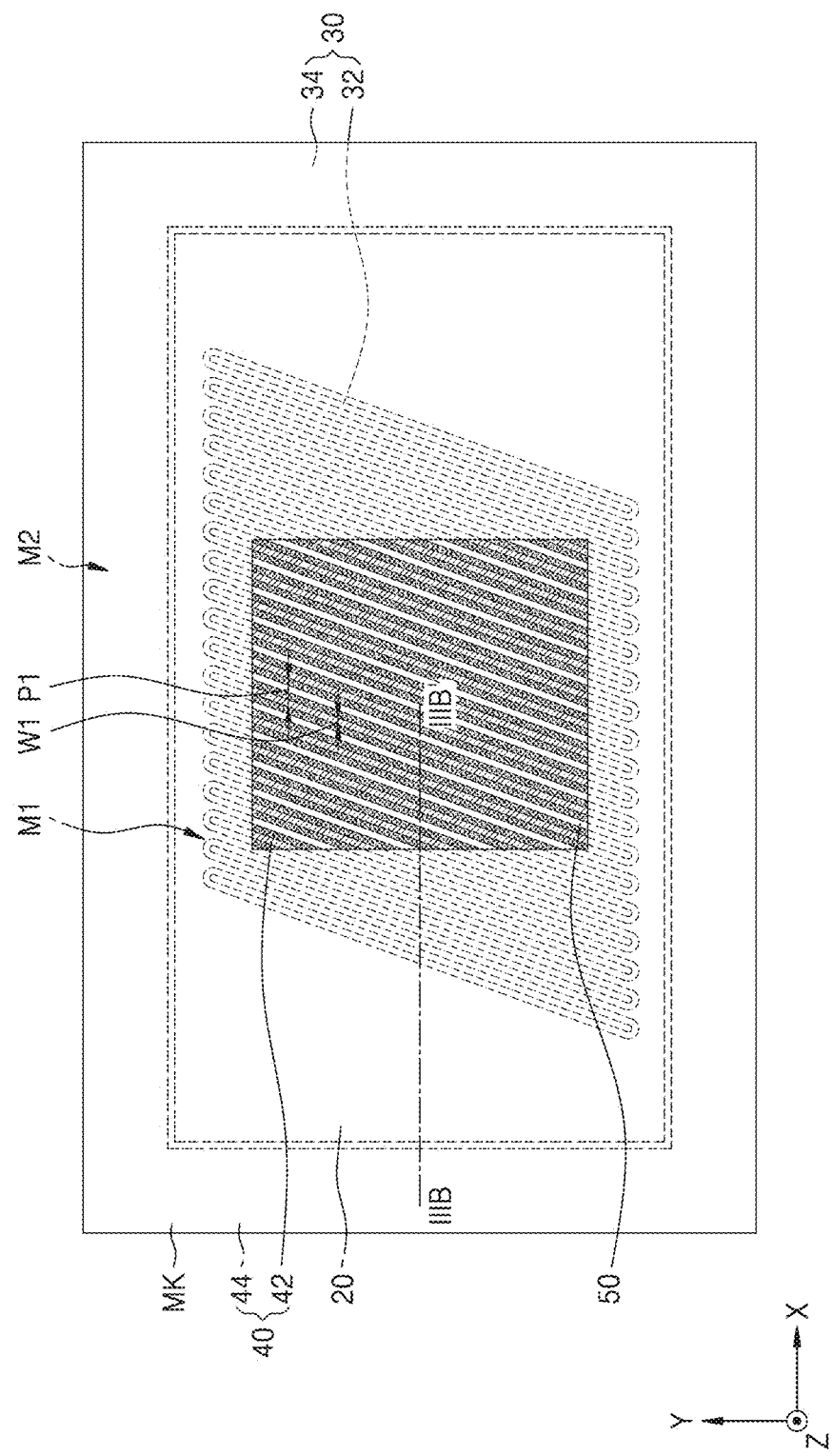
Figure 3B:
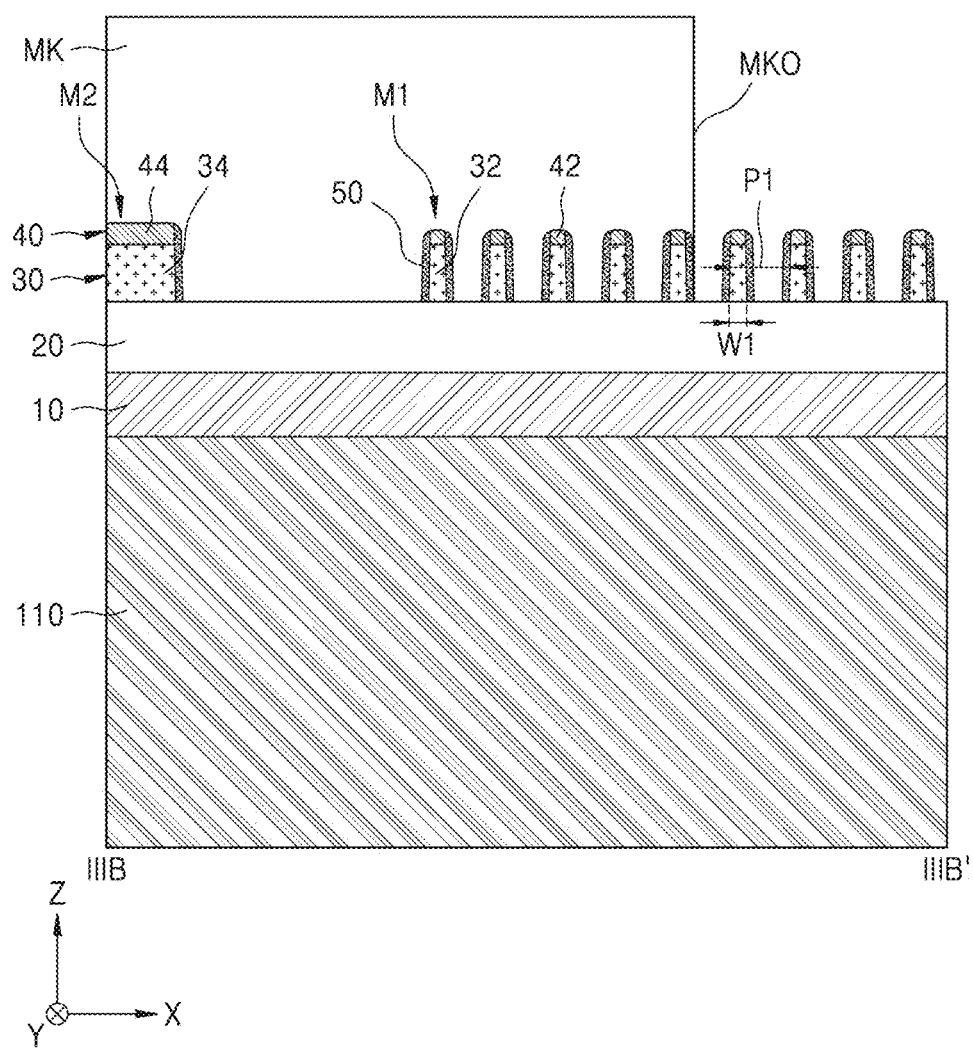

Referring to FIGS. 3A and 3B together, a region mask layer MK that does not cover portions of the plurality of first base structures M1 but that covers both the remaining portions of the plurality of first base structures M1 and all of the at least one second base structure M2, may be formed. In some example embodiments, the region mask layer MK may include photoresist and/or other materials such as an anti-reflective coating (ARC) material. The region mask layer MK may have a region opening MKO that exposes a portion of the plurality of first base structures M1. The region opening MKO may correspond to a memory cell region CR shown in FIG. 11B. The region mask opening MKO may be formed with a photolithographic process such as an I-Line photolithographic process; however, example embodiments are not limited thereto.

The remaining portions of the plurality of first base structures M1 covered by the region mask layer MK may be or correspond to the portions adjacent to the at least one second base structure M2, among the plurality of first base structures M1. The remaining portions of the plurality of first base structures M1 covered by the region mask layer MK may be or correspond to the portions disposed between the portions of the plurality of first base structure M1 that are exposed within the region opening MKO not to be covered by the region mask layer MK and the at least one second base structure M2.

Figure 4A:
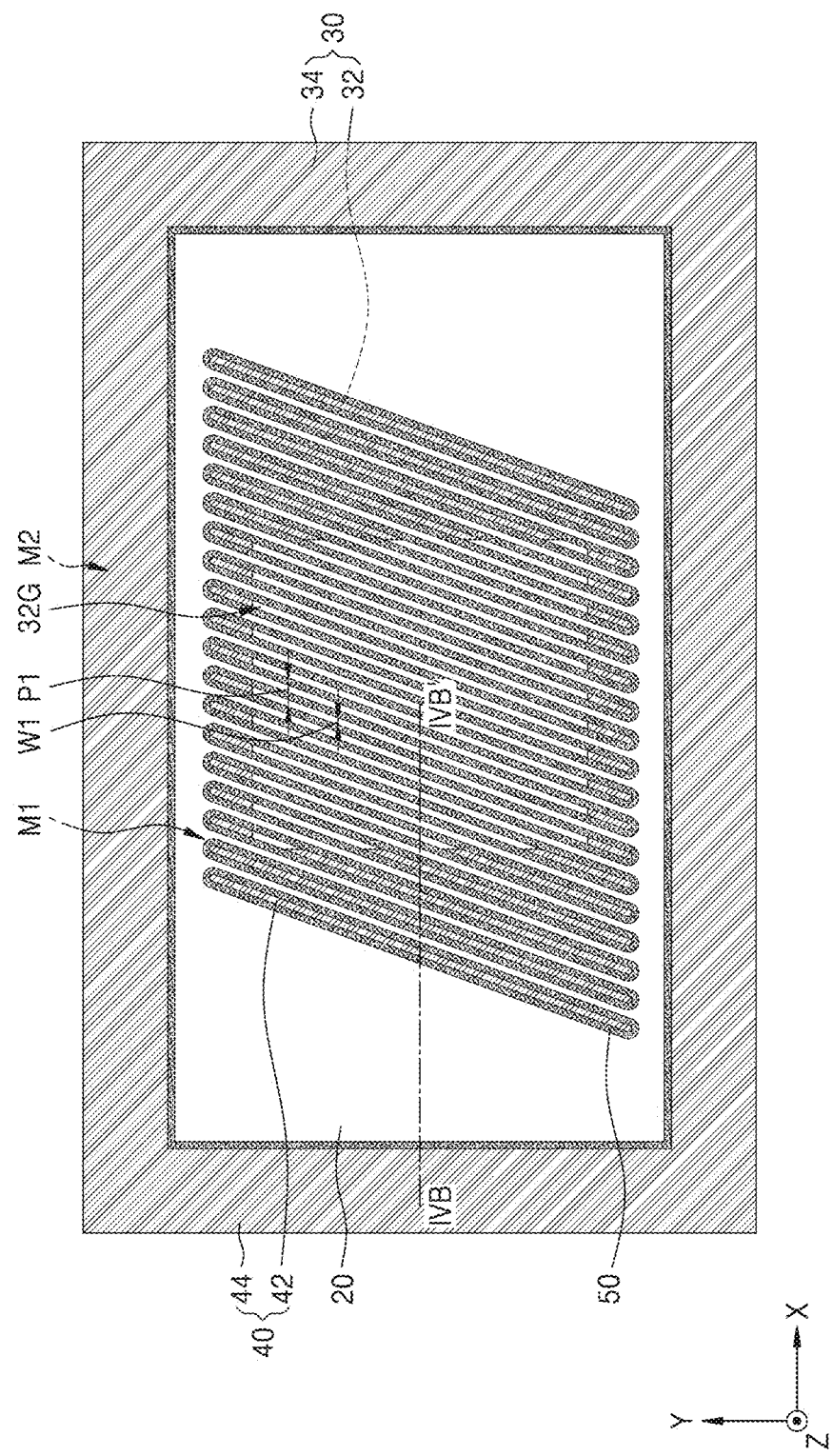
Figure 4B:
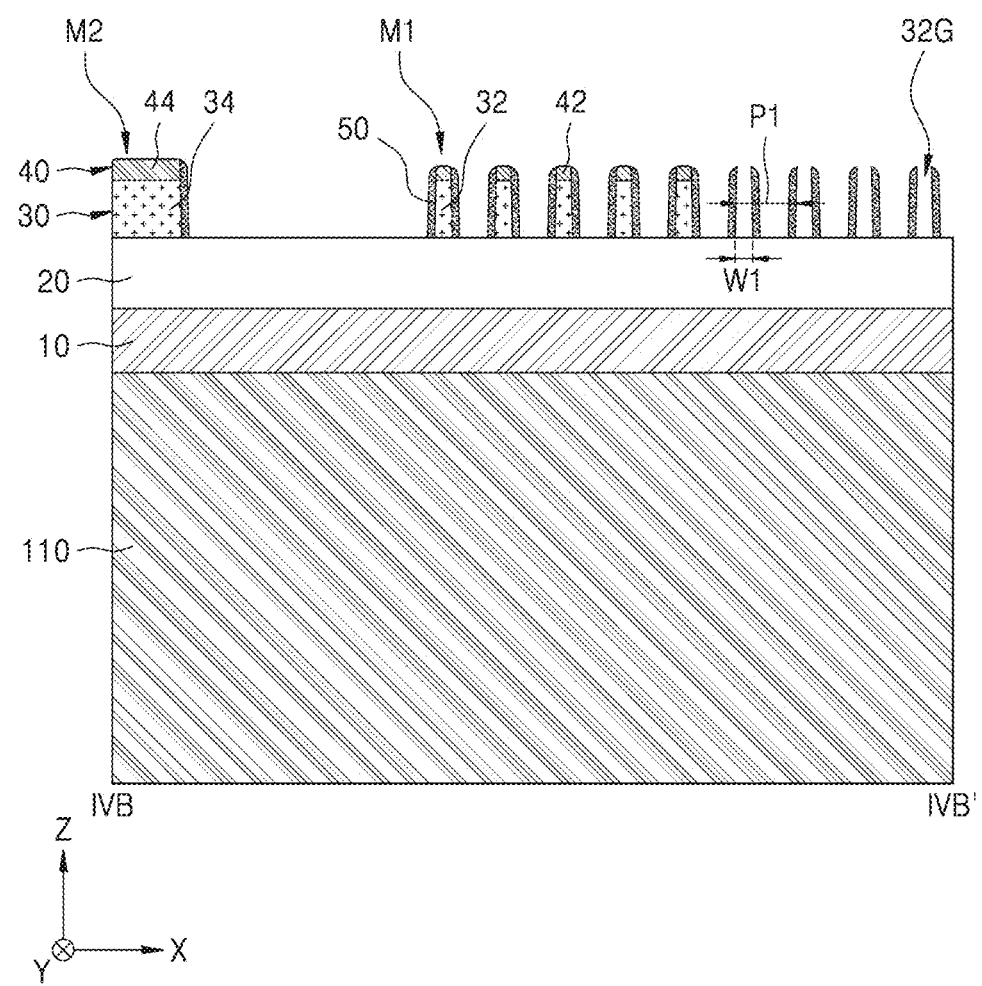

Referring to FIGS. 3A, 4A, and 4B together, a plurality of removal spaces 32G may be formed by removing portions that are exposed within the region opening MKO and are not covered by the region mask layer MK, among the plurality of first base structures M1 each composed of the first base mask pattern 32 and the second base mask pattern 42. For example, portions of the plurality of second base mask patterns 42 exposed within the region opening MKO may be initially removed, and then portions of the plurality of first base mask patterns 32 that are exposed after removing the portions of the plurality of second base mask patterns 42 may be removed to form the plurality of removal spaces 32G.

The plurality of removal spaces 32G may be or may correspond to spaces to be defined between portions of the plurality of spacer patterns 50. After forming the plurality of removal spaces 32G, the region mask layer MK may be removed.

The hard mask layer 20 may be exposed on bottom surfaces of the removal spaces 32G. In a region corresponding to the region opening MKO, only the spacer patterns 50 may be disposed on the hard mask layer 20, while in a region covered by the region mask layer MK, the remaining portions that are not removed among the plurality of first base structures M1, the at least one second base structure M2, and the spacer patterns 50 covering sidewalls thereof, may be disposed together.

Figure 5A:
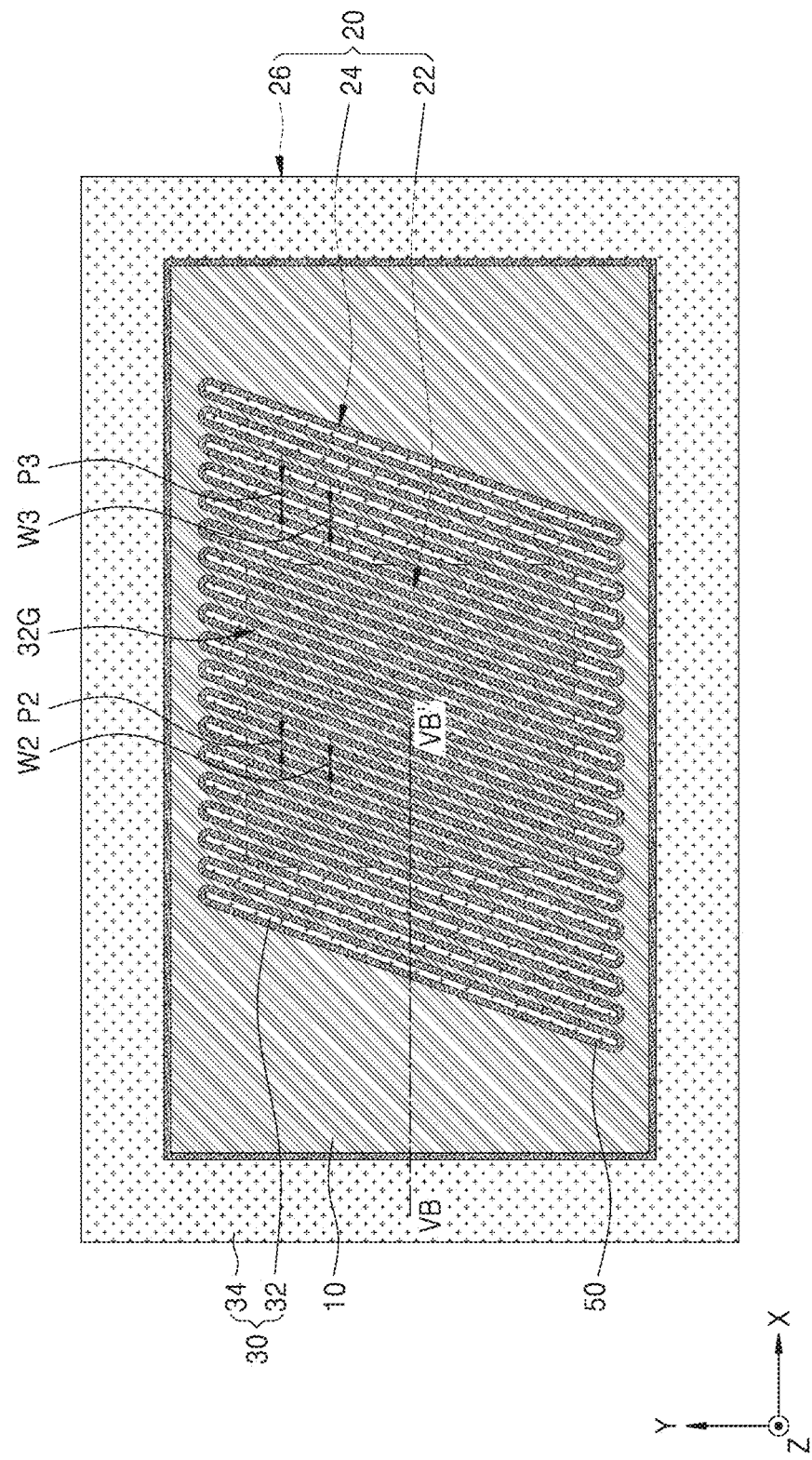
Figure 5B:
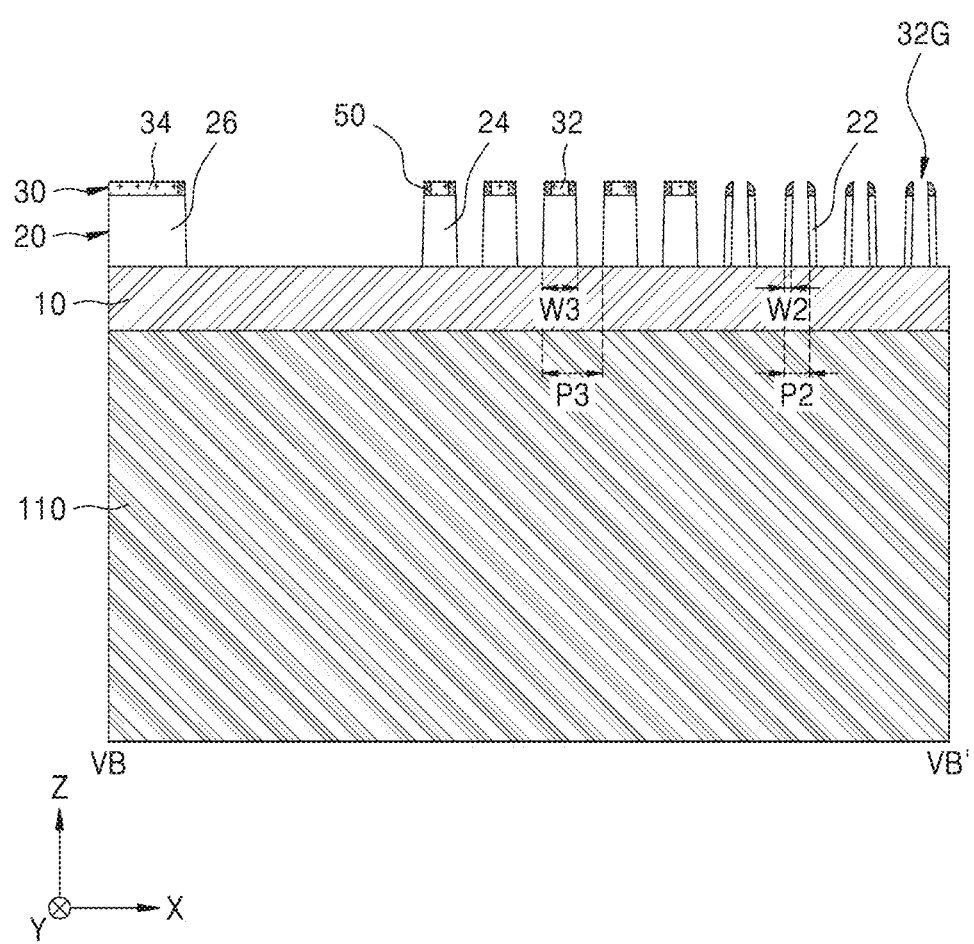

Referring to FIGS. 4A, 5A, and 5B, after forming the plurality of removal spaces 32G, a patterning process for removing portions of the hard mask layer 20 may be performed using the plurality of first base structures M1, the at least one second base structure M2, and the plurality of spacer patterns 50 as an etch mask, and thus a plurality of first hard mask patterns 22, a plurality of second hard mask patterns 24, and at least one third hard mask pattern 26 may be formed.

The plurality of first hard mask patterns 22 may be formed by patterning a portion of the hard mask layer 20 disposed in the region corresponding to the region opening MKO shown in FIGS. 3A and 3B. For example, the plurality of first hard mask patterns 22 may be formed by removing the portion of the hard mask layer 20 using portions of the plurality of spacer patterns 50 that contact the plurality of removal spaces 32G and that do not contact the plurality of first base structures M1, as the etch mask.

The plurality of second hard mask patterns 24 may be formed by removing a portion of the hard mask layer 20 using the plurality of first base structures M1 and the spacer pattern 50 covering the plurality of first base structures M1 as the etch mask, in the region covered by the region mask layer MK shown in FIGS. 3A and 3B. For example, the plurality of second hard mask patterns 24 may be formed by removing the portion of the hard mask layer 20 using the plurality of first base structures M1 and portions of the plurality of spacer patterns 50 where the portions of the plurality of spacer patterns 50 contact the plurality of first base structures M1, as the etch mask.

The at least one third hard mask pattern 26 may be formed by removing a portion of the hard mask layer 20 using the at least one second base structure M2 and the spacer patterns 50 covering side walls thereof shown in FIGS. 3A and 3B as the etch mask.

Among the plurality of spacer patterns 50, the portions that do not contact the plurality of first base structures M1 may be used as the etch mask for forming the plurality of first hard mask patterns 22, the portions that contact the plurality of first base structures M1 may be used together with the plurality of first base structures M1 as the etch mask for forming the plurality of second hard mask patterns 24, and the portions that contact the at least one second base structure M2 may be used together with the at least one second base structure M2 as the etch mask for forming the at least one third hard mask pattern 26.

In the process of forming the plurality of first hard mask patterns 22, the plurality of second hard mask patterns 24, and the at least one third hard mask pattern 26, at least a portion of the first mask layer 30 and the second mask layer 40 may be removed. In some example embodiments, in the process of forming the plurality of first hard mask patterns 22, the plurality of second hard mask patterns 24, and the at least one third hard mask pattern 26, all of the second mask layer 40 and at least a portion of the first mask layer 30 may be removed, or all of the second mask layer 40 and a portion of the spacer pattern 50 covering the sidewalls of at least a portion of the first mask layer 30 may be removed together.

The plurality of first hard mask patterns 22 may have a second width W2 and may be arranged in a second pitch P2 in the first horizontal direction (the X direction) or in the short axis direction. The second pitch P2 may have a value of about 2 times the second width W2. In some example embodiments, the second width W2 may have the value equal to or substantially similar to the first width W1 shown in FIGS. 1A and 1B, and the second pitch P2 may have a value of about ½ of the first pitch P1 shown in FIGS. 1A and 1B. For example, the second pitch P2 may be about 0.1 μm to about 1 μm.

The plurality of second hard mask patterns 24 may have a third width W3 and may be arranged in a third pitch P3 in the first horizontal direction (the X direction) or in the short axis direction. The third pitch P3 may have a value greater than the third width W3. In some example embodiments, the third width W3 may have a value of about 3 times the first width W1 shown in FIGS. 1A and 1B, and the third pitch P3 may have a value similar to or equal to the first pitch P1 shown in FIGS. 1A and 1B. For example, the third width W3 may have the value of about 3 times the second width W2, and the third pitch P3 may have the value of about 2 times the second pitch P2. For example, the third pitch P3 may be about 0.2 μm to about 2 μm.

The third pitch P3 may be an integral multiple of the second pitch P2, and/or the second pitch P2 may be an integral multiple of the first pitch P1; additionally or alternatively, the third width W3 may be an integral multiple of the second width W2, and/or the second width W2 may be an integral multiple of the first width W1; however, example embodiments are not limited thereto.

Figure 6A:
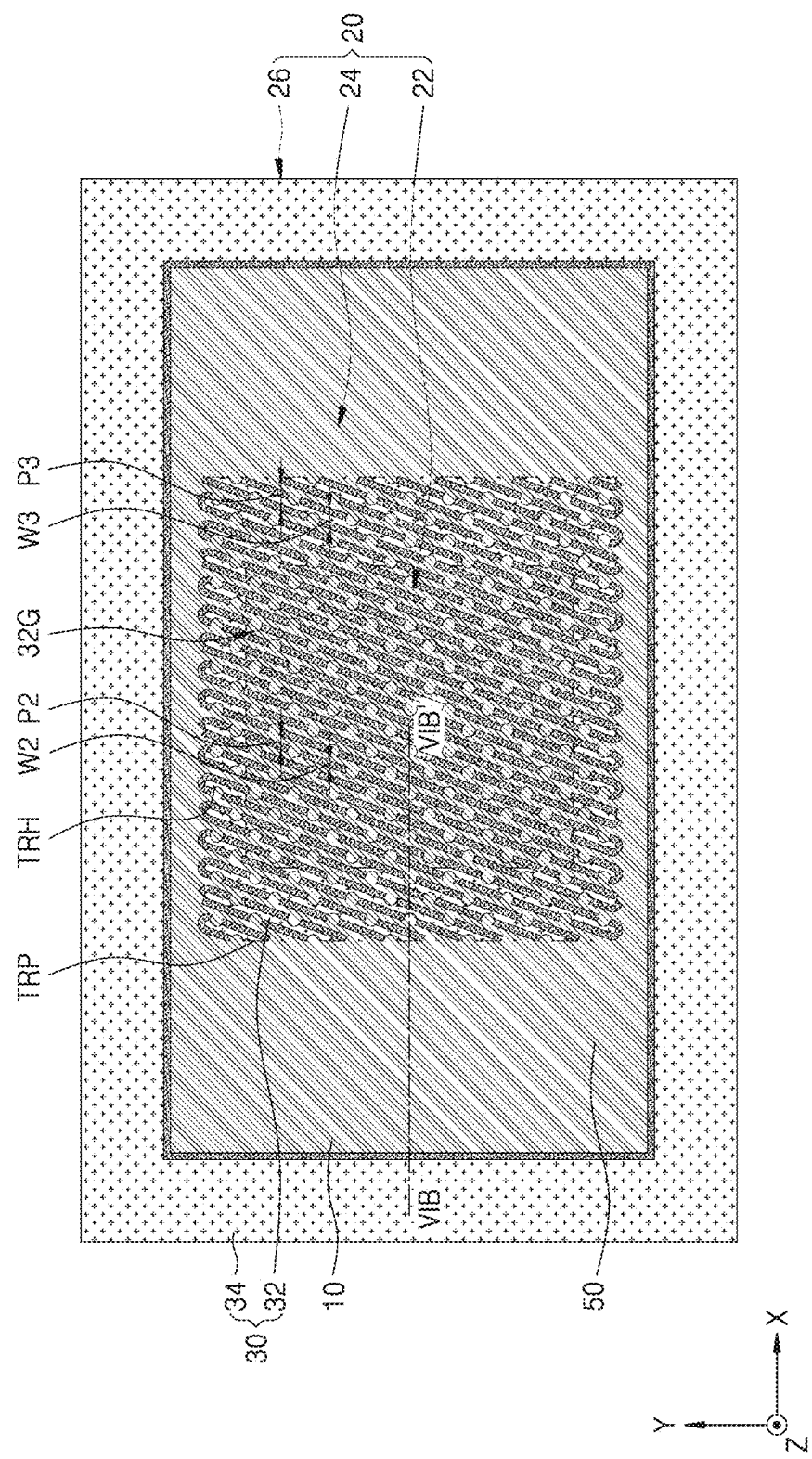
Figure 6B:
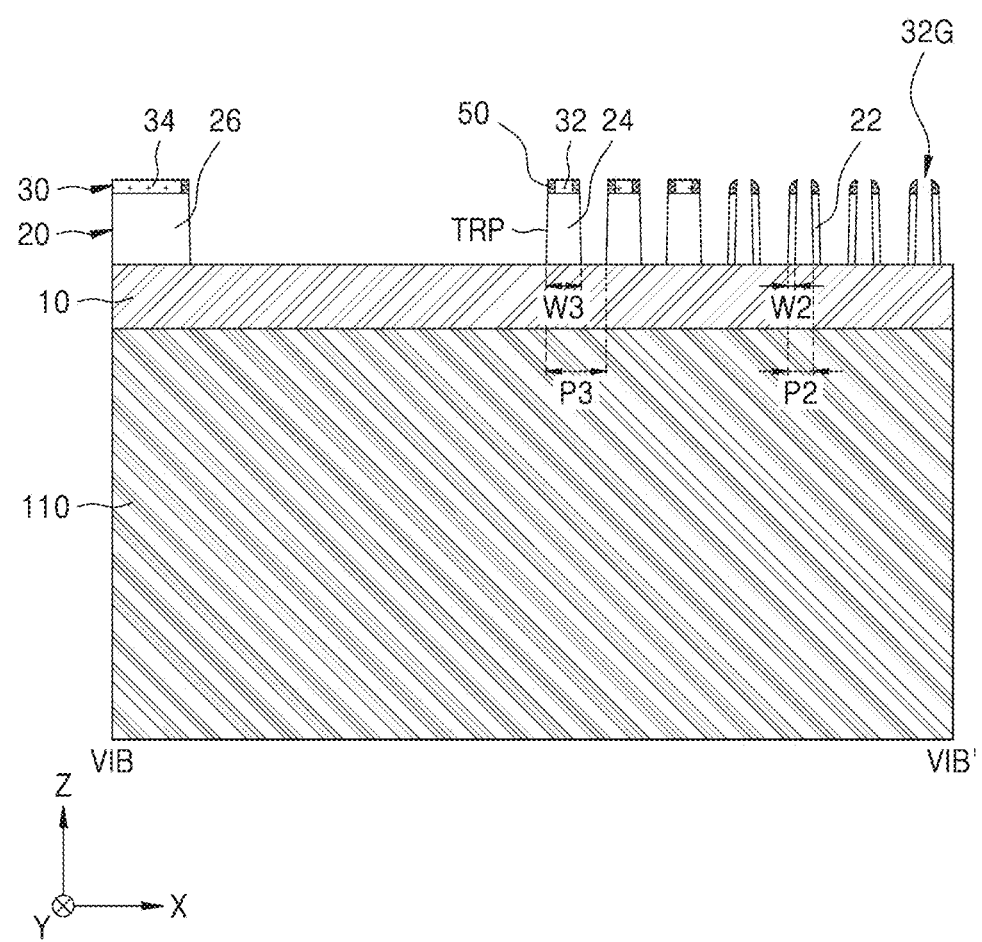

Referring to FIGS. 6A and 6B together, a trimming process for removing a portion of the plurality of first hard mask patterns 22 and a portion of the plurality of second hard mask patterns 24, may be performed to form a plurality of first trimming space TRH and at least one second trimming space TRP. The plurality of first trimming space TRH may be the space formed by removing the plurality of first hard mask patterns 22. The at least one second trimming space TRP may be the space formed by removing a portion of the plurality of second hard mask patterns 24 adjacent to the at least one third hard mask pattern 26.

In some example embodiments, the plurality of first trimming spaces TRH may be formed to be arranged in a honeycomb shape, e.g. arranged in a hexagonal or triangular lattice such as a regular hexagonal or triangular lattice. For example, the plurality of first trimming spaces TRH may be arranged in a line in the first horizontal direction (the X direction) and arranged in a zigzag in the second horizontal direction (the Y direction). Alternatively, for example, the plurality of first trimming spaces TRH may be arranged in a line in the second horizontal direction (the Y direction) and arranged in a zigzag in the first horizontal direction (the X direction).

The first hard mask pattern 22 may be separated by the first trimming spaces TRH to have the relatively long island shape with the short axis and the long axis in the same plane. Portions of the first hard mask pattern 22 separated by the first trimming spaces TRH may have the long axis in the diagonal direction with respect to the first horizontal direction (the X direction) and the second horizontal direction (the Y direction), and may be arranged to extend parallel to each other. The portions of the first hard mask pattern 22 separated by the first trimming spaces TRH may be extended in the long axis direction while having generally the same length.

One end of the plurality of second hard mask patterns 24 that faces the third hard mask pattern 26, wherein portions of the plurality of second hard mask patterns 24 is removed by the at least one second trimming space TRP, may be arranged in the second horizontal direction (the Y direction).

The portions of the first hard mask pattern 22 separated by the first trimming spaces TRH may be referred to as a plurality of active region mask patterns. The plurality of second hard mask patterns 24 from which portions of the plurality of second hard mask patterns 24 have been removed by the at least one second trimming space TRP may be referred to as a plurality of dummy active region mask patterns. The at least one third mask pattern 26 may be referred to as at least one logic active region mask pattern.

FIGS. 6A and 6B show that a portion of the plurality of second hard mask patterns 24 adjacent to the at least one third hard mask pattern 26 is removed in the first horizontal direction (the X direction) and thus at least one trimming space TRP is formed, but is not limited thereto. In some example embodiments, portions of the plurality of second hard mask patterns 24 adjacent to the at least one third hard mask pattern 26 may be removed in the second horizontal direction (the Y direction). In some other embodiments, portions of the plurality of second hard mask patterns adjacent to the at least one third hard mask pattern 26 may be removed in each of the first horizontal direction (the X direction) and the second horizontal direction (the Y direction).

Figure 7A:
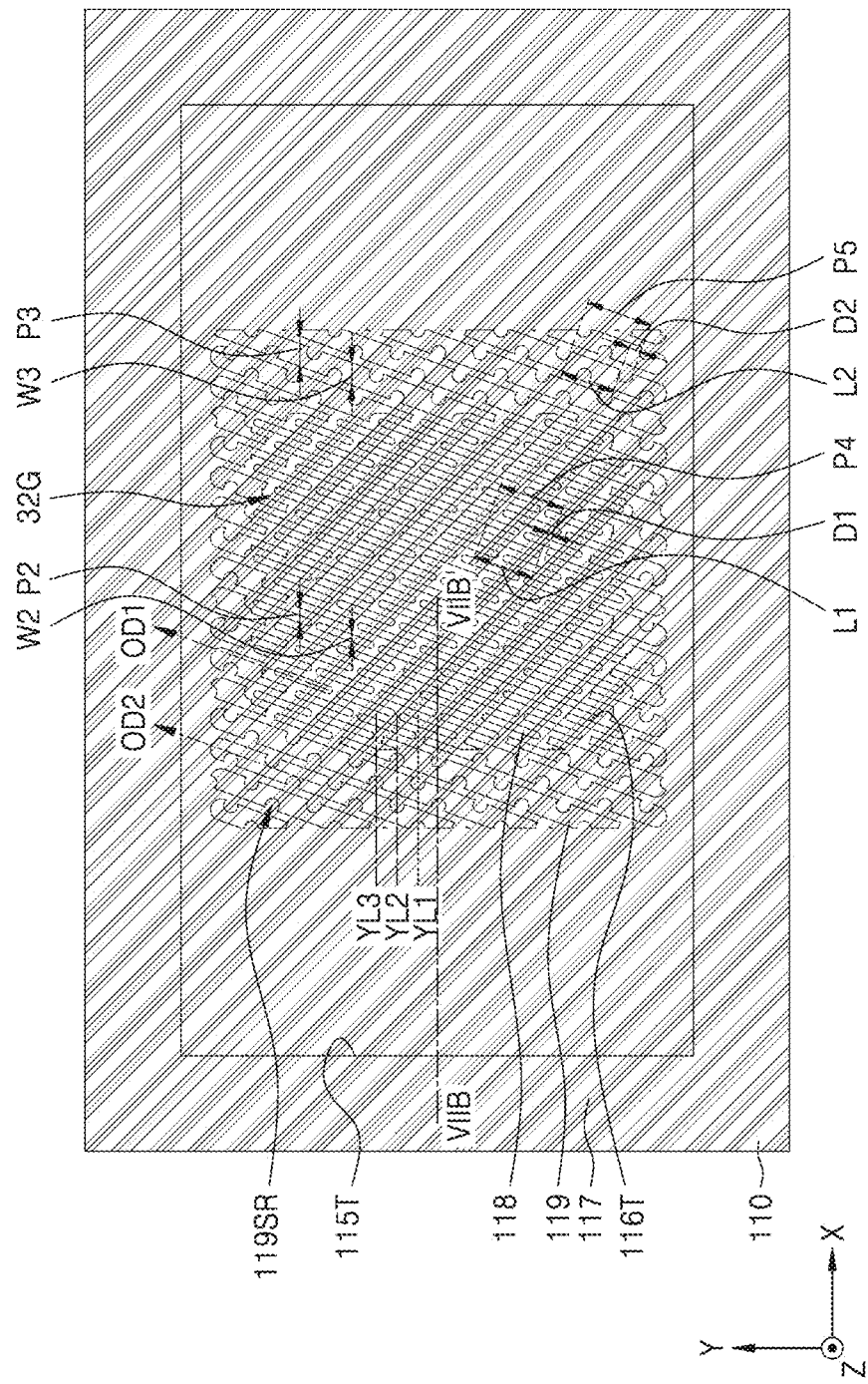
Figure 7B:
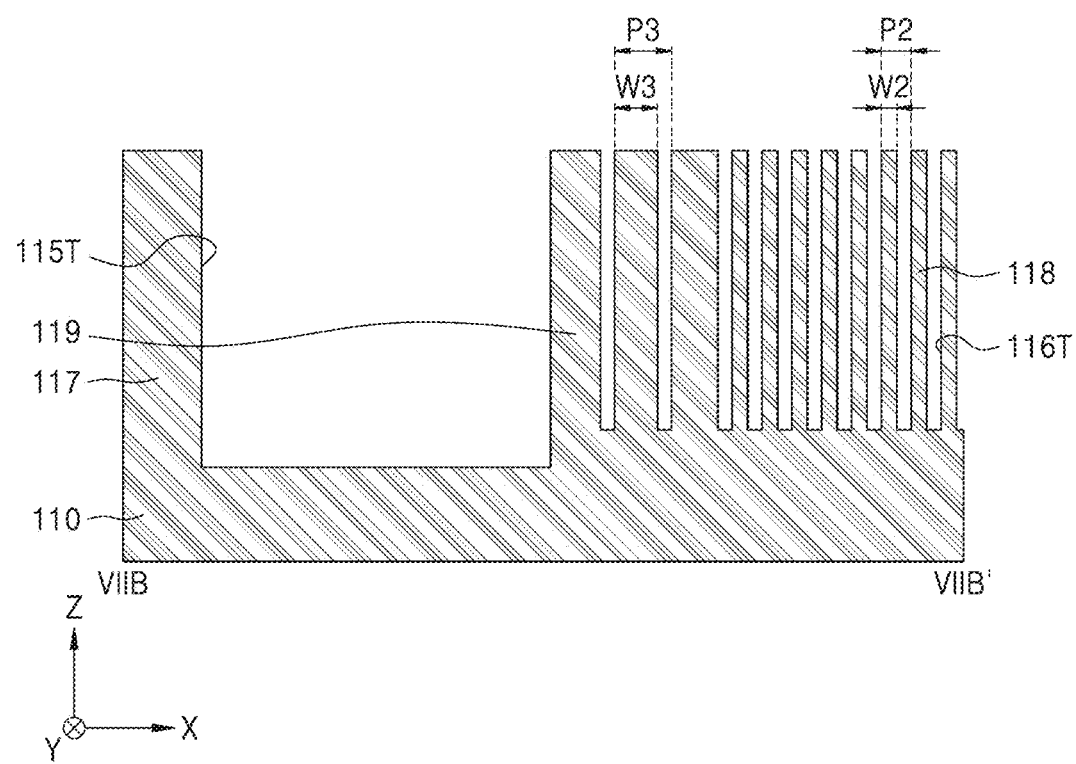

Referring to FIGS. 6A, 7A, and 7B together, after performing the trimming process, using the plurality of first hard mask patterns 22, the at least one second hard mask pattern 22, and the plurality of spacer patterns 50 as the etch mask, the buffer layer 10 and the substrate 110 may be patterned to form a plurality of active regions 118, a plurality of dummy activity regions 119, and at least one logic active region 117.

The plurality of active regions 118 and the plurality of dummy active regions 119 may be portions of the substrate 110 defined by device isolation trenches 116T, and the at least one logic active region 117 may be a portion of the substrate 110 defined by a logic device isolation trench 115T. The logic device isolation trench 115T may be disposed between the plurality of dummy active regions 119 and the at least one logic active region 117.

The logic device isolation trench 115T may be deeper into the substrate 110 than the device isolation trench 116T, e.g. may be deeper owing to a difference in pattern densities among the at least one logic active region 117, the plurality of active regions 118, the plurality of dummy active regions 119; however, example embodiments are not limited thereto.

The plurality of active regions 118 may be portions formed by removing portions of the substrate 110, using portions of the first hard mask pattern 22 separated by the first trimming space TRH, for example a plurality of active region mask patterns, as the etch mask. The plurality of dummy active regions 119 may be portions formed by removing portions of the substrate 110, using the remaining portion of the plurality of second hard mask patterns 24, for example, a plurality of dummy active region mask patterns, as the etch mask. The at least one logic active region 117 may be a portion formed by removing a portion of the substrate 110, using the at least one third hard mask pattern 26, that is, at least one logic active region mask pattern, as the etch mask.

The plurality of active regions 118 may have a relatively long island shape having the short axis and the long axis in the same plane. The island shape may have wings (not shown), e.g. protrusions, near the center of the island shape; however, example embodiments are not limited thereto. In some example embodiments, the plurality of active regions 118 may be arranged to have the long axis in the diagonal direction with respect to the first horizontal direction (the X direction) and the second horizontal direction (the Y direction). The plurality of active regions 118 may be repeatedly arranged with a fourth pitch P4 in the long axis direction, that is, a first long axis direction OD1. The plurality of active regions 118 may be extended in the first long axis direction OD1 while having generally the same length. For example, each of the plurality of active regions 118 may be extended with a first length L1 in the first long axis direction OD1. The plurality of active regions 118 may be arranged to be spaced apart from each other at first intervals D1 that are substantially equal to each other in the first long axis direction OD1. The fourth pitch P4 may be a sum of the first length L1 and the first interval D1.

The plurality of active regions 118 may have the second width W2 and the second pitch P2 in the first horizontal direction (the X direction) and/or a first short axis direction orthogonal to the first long axis direction OD1. The second pitch P2 may have a value of about 2 times the second width W2, or may have a value of about another integer times the second width W2.

The plurality of dummy active regions 119 may have a relatively long island shape having the short axis and the long axis in in the same plane. In some example embodiments, the plurality of dummy active regions 119 may be arranged to have the long axis in the diagonal direction relative to the first horizontal direction (the X direction) and the second horizontal direction (the Y direction). At least one of the plurality of dummy active regions 119 may have sidewall recesses 119SR on both sidewalls thereof in the long axis direction, for example, a second long axis direction OD2 that is the same as/parallel to the first long axis direction OD1.

The plurality of dummy active regions 119 may have the third width W3 and the third pitch P3 in the first horizontal direction (the X direction), or alternatively or additionally the second short axis direction orthogonal to the second long axis direction OD2. The third pitch P3 may have a value greater than the third width W3. In some example embodiments, a ratio of the third width W3 to the second width W2 may have a value greater than a ratio of the third pitch P3 to the second pitch P2. For example, the third width W3 may have the value of about 3 times the second width W2, and the third pitch P3 may have the value of about 2 times the second pitch P2.

The plurality of sidewall recesses 119SR may be repeated with a fifth pitch P5 in one sidewall of the at least one of the plurality of dummy active regions 119 in the second long axis direction OD2. Two sidewall recesses 119SR may be arranged to be spaced apart by the second length L2 in one sidewall of the dummy active regions 119 in the second long axis direction OD2. One sidewall recess 119SR may have a maximum value of a second interval D2 in the second long axis direction OD2. The first long axis direction OD1 may be the same direction as the second long axis direction OD2.

The fifth pitch P5 may be the sum of the second length L2 and the second interval D2. The fifth pitch P5 may substantially have the same value as the fourth pitch P4. In some example embodiments, the first length L1 may substantially have the same value as the second length L2, and the first interval D1 may substantially have the same value as the second interval D2.

In some example embodiments, the first length L1 and the second length L2 may have different values, and the first interval D1 and the second interval D2 may have different values, but the sum of the first length L1 and the first interval D1, for example, the fourth pitch P4 may substantially have the same value as the sum of the second length L2 and the second interval D2, for example, the fifth pitch P5.

Portions of the device isolation trenches 116T disposed between the active regions 118 adjacent to each other in the first long axis direction OD1, and the sidewall recesses 119SR formed in the plurality of dummy active regions 119 may be formed at positions corresponding to the plurality of first trimming spaces TRH that are formed by performing the trimming process described in FIGS. 6A and 6B. Thus, the portions of the device isolation trenches 116T disposed between the active regions 118 adjacent to each other in the first long axis direction OD1, and the sidewall recesses 119SR formed in the plurality of dummy active regions 119 may be arranged in the same arrangement manner.

Thus, the portions of the device isolation trenches 116T disposed between the active regions 118 adjacent to each other in the first long axis direction OD1, and the sidewall recesses 119SR formed in the plurality of dummy active regions 119 may be formed to be arranged in the honeycomb shape/honeycomb lattice. For example, the portions of the device isolation trenches 116T disposed between the active regions 118 adjacent to each other in the first long axis direction OD1, and the sidewall recesses 119SR formed in the plurality of dummy active regions 119 may be arranged together in a line in the first horizontal direction (the X direction) and arranged in a zigzag in the second horizontal direction (the Y direction). Alternatively or additionally, for example, the portions of the device isolation trenches 116T disposed between the active regions 118 adjacent to each other in the first long axis direction OD1, and the sidewall recesses 119SR formed in the plurality of dummy active regions 119 may be arranged together in a line in the second horizontal direction (the Y direction) and arranged in a zigzag in the first horizontal direction (the X direction).

For example, the sidewall recesses 119SR of the plurality of dummy active regions 119 may be arranged in a line along a plurality of horizontal lines YL1, YL1, and YL3 that are disposed at equal intervals in the second horizontal direction (the Y direction), and the portions disposed between the active regions 118 adjacent to each other in the first long axis direction OD1 among the device isolation trenches 116T may be arranged in a line along the plurality of horizontal lines YL1, YL1, and YL3 where the sidewall recesses 119SR of the plurality of dummy active regions 119 also across. For example, the portions of the device isolation trenches 116T disposed between the active regions 118 adjacent to each other in the first long axis direction OD1 and the sidewall recesses 119SR formed in the plurality of dummy active regions 119 may be arranged together in a line along the plurality of horizontal lines YL1, YL1, and YL3 that are disposed at equal intervals in the second horizontal direction (the Y direction).

Likewise, for example, the portions of the device isolation trenches 116T disposed between the active regions 118 adjacent to each other in the first long axis direction OD1 and the sidewall recesses 119SR formed in the plurality of dummy active regions 119 may be arranged together in a line along the plurality of horizontal lines (not shown) that are disposed at equal intervals in the first horizontal direction (the X direction).

Figure 8A:
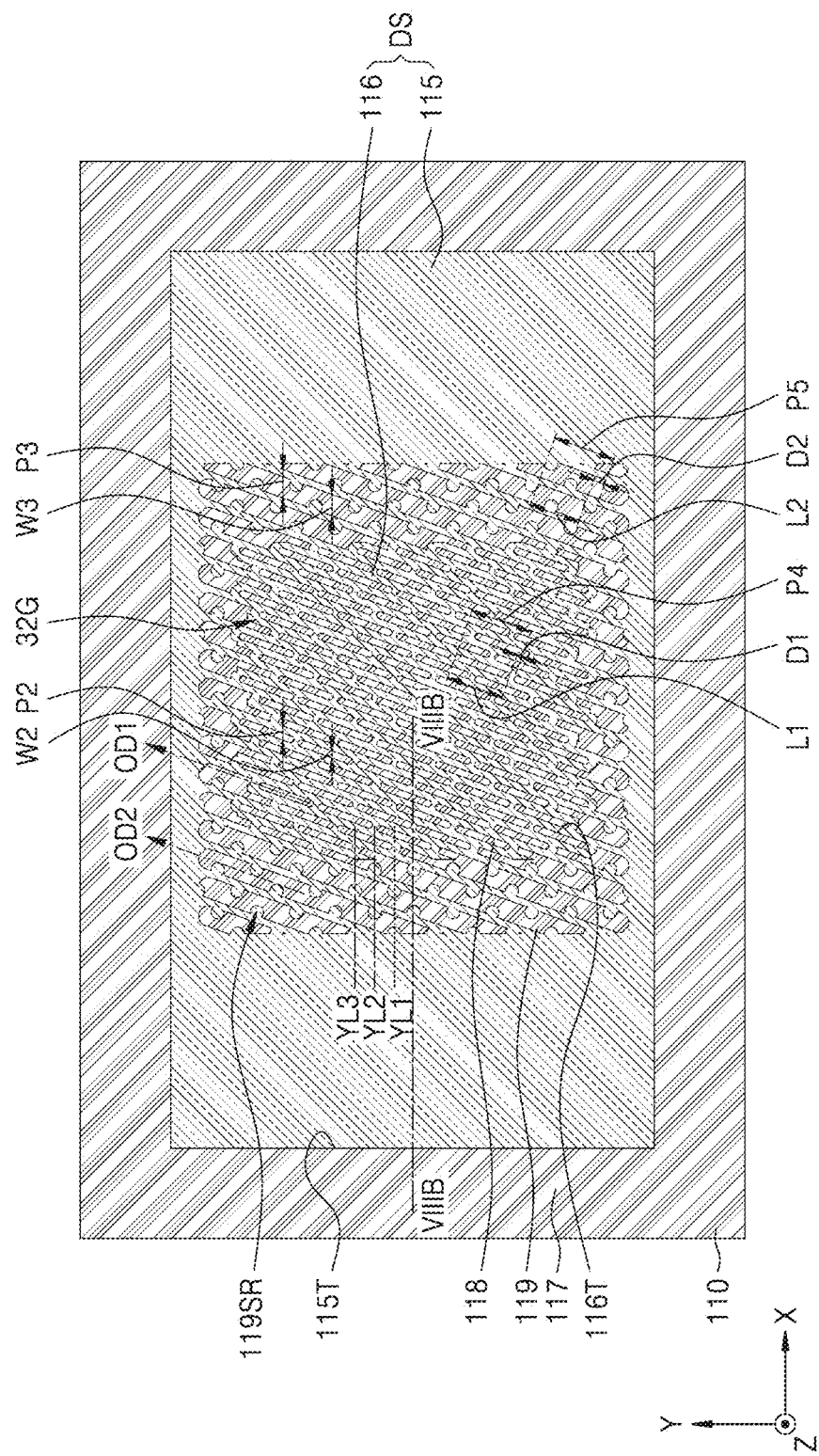
Figure 8B:
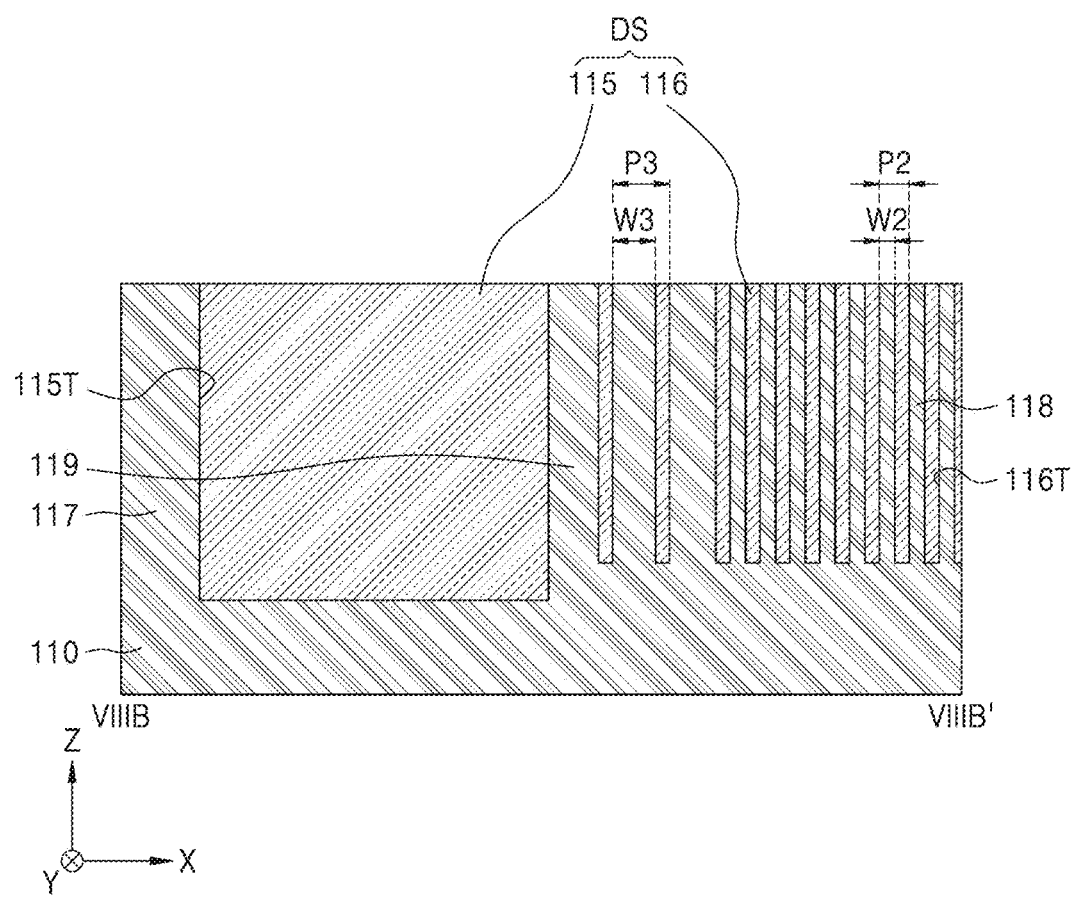

Referring to FIGS. 8A and 8B together, a device isolation film 116 for filling the device isolation trench 116T and a logic device isolation film 115 for filling the logic device isolation trench 115T may be formed. The plurality of active regions 118 and the plurality of dummy active regions 119 may be defined in the substrate 110 by the device isolation film 116, and at least one logic active region 117 may be defined in the substrate 110 by the logic device isolation film 115. The logic device isolation film 115 may be disposed between the plurality of dummy active regions 119 and the at least one logic active region 117.

In some example embodiments, the device isolation film 116 and the logic device isolation film 115 may be formed together (e.g. at the same time), and may be referred to as the device isolation structure DS together. Between the plurality of dummy active regions 119 and the at least one logic active region 117, the device isolation film 116 and the logic device isolation film 115 may not be clearly distinguished from each other. The device isolation structure DS may fill the plurality of sidewall recesses 119SR. For example, the device isolation film 116 may fill the plurality of sidewall recesses 119SR.

In some example embodiments, the device isolation film 116 and the logic device isolation film 115 may include a triple layer composed of a first device isolation film, a second device isolation film, and a third device isolation film, but example embodiments not limited thereto. For example, the first device isolation film may conformally cover inner side surfaces and bottom surfaces of the device isolation trench 116T and the logic device isolation trench 115T. In some example embodiments, the first device isolation film may include silicon. For example, the second device isolation film may conformally cover the first device isolation film. In some example embodiments, the second device isolation film may include silicon nitride. For example, the third device isolation film may fill the device isolation trench 116T and the logic device isolation trench 115T while covering the second device isolation film. In some example embodiments, the third device isolation film may include silicon oxide. For example, the third device isolation film may include silicon oxide formed of tonen silazene (TOSZ). In some example embodiments, the device isolation film 116 and the logic device isolation film 115 may include a single layer composed of one kind of insulating film, or a double layer composed of two kinds of insulating films, or a multiple layer composed of combination of at least four kinds of insulating films. For example, each of the device isolation film 116 and the logic device isolation film 115 may include the single layer composed of silicon oxide.

The device isolation structure DS may be formed with a process such as a shallow trench isolation (STI) process, and may be formed with an oxide such as a high density plasma (HDP) and/or a spin-on glass (SOG) process; however, example embodiments are not limited thereto. The device isolation structure DS may be planarized, e.g. may be planarized with a chemical mechanical planarization (CMP) process and/or an etch-back process; however, example embodiments are not limited thereto.

Since the third width W3 and the third pitch P3 of the plurality of dummy active regions 119 have values greater than the second width W2 and the second pitch P2 of the plurality of active regions 118, when in a process of forming the device isolation structure DS composed of the device isolation film 116 and the logic device isolation film 115, shrinkage may occur in the material that forms the device isolation structure DS, the plurality of dummy active regions 119 may function as a dam that prevents or reduces the amount and/or impact of warpage in the plurality of active regions 118 from being occurred. Alternatively or additionally, since the plurality of dummy active regions 119 may be arranged to surround the plurality of active regions 118 and may be formed by substantially the same process as the plurality of active regions 118, the plurality of dummy active regions 119 may also function as a dummy pattern so that the plurality of active regions 118 are formed to have approximately uniform shape and arrangement.

Figure 9:
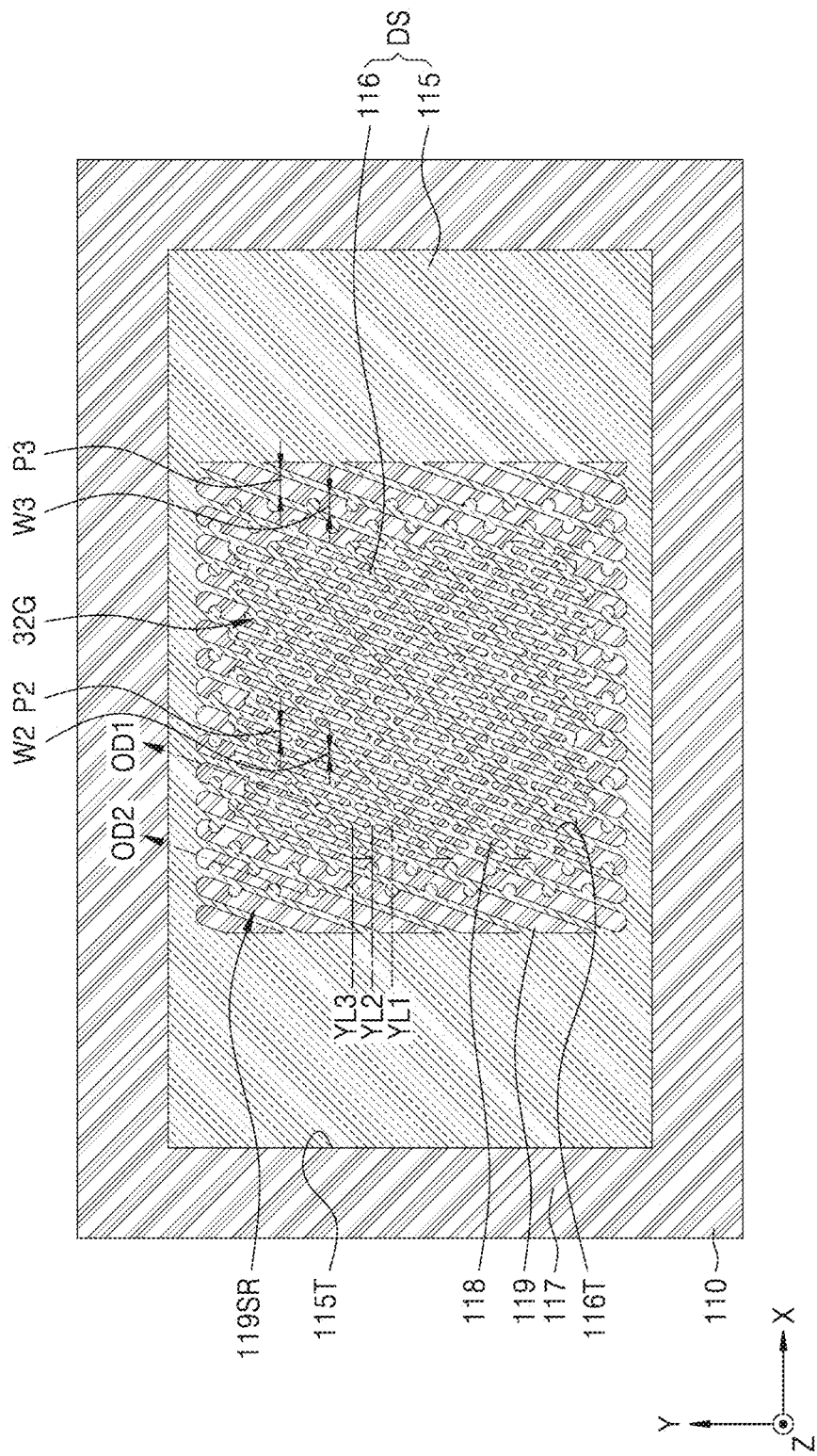
FIGS. 9 and 10 are plan views illustrating a substrate having an active region for manufacturing a semiconductor memory device according to some example embodiments of inventive concepts.
Figure 10:
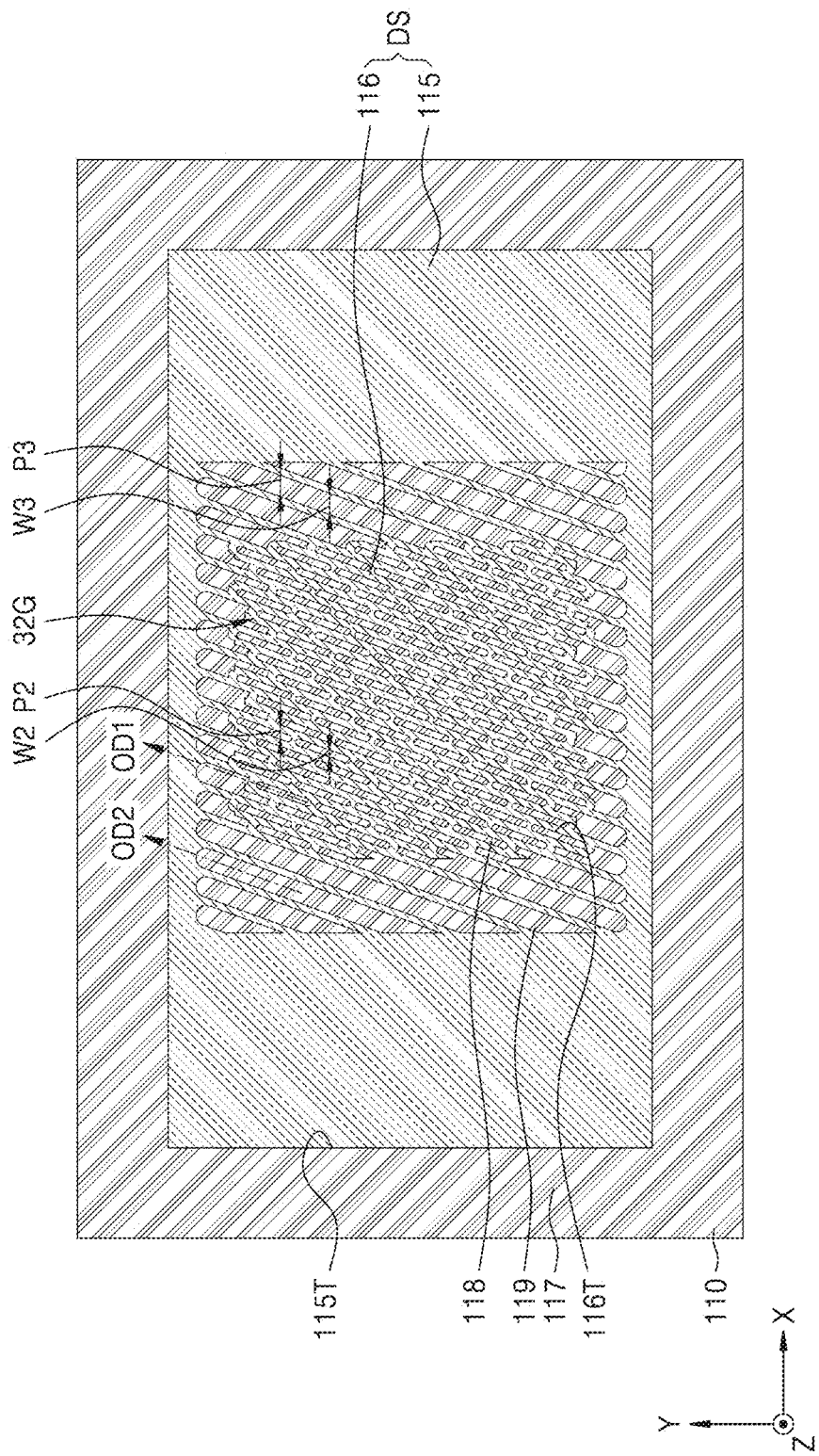

FIGS. 9 and 10 are plan views respectively illustrating a substrate having an active region for manufacturing a semiconductor memory device according to some example embodiments of inventive concepts.

Referring to FIG. 9, the substrate 110 may include the plurality of active regions 118 and the plurality of dummy active regions 119 to be defined by the device isolation film 116 that fills the device isolation trench 116T, and the at least one logic active region 117 defined by the logic device isolation film 115 that fills the logic device isolation trench 115T.

Some of the plurality of dummy active regions 119 may have/may define sidewall recesses 119SR in portions of both sidewalls thereof in the long axis direction, that is, the second long axis direction OD2. The sidewall recesses 119SR may be disposed in portions of the sidewall adjacent to the plurality of active regions 118, among the both sidewalls in the second long axis direction OD2 of the plurality of dummy active regions 119, and may not be disposed in portions of the sidewall adjacent to the at least one logic active region 117.

For example, in the process of forming the plurality of first trimming spaces TRH shown in FIGS. 6A and 6B, when forming the plurality of first trimming spaces TRH with a predetermined gap from the at least one second trimming space TRP, the sidewall recesses 119SR may be formed so as not to be disposed on the portion adjacent to at least one logic active region 117.

Referring to FIG. 10, the substrate 110 may include the plurality of active regions 118 and the plurality of dummy active regions 119 to be defined by the device isolation film 116 that fills the device isolation trench 116T, and the at least one logic active region 117 defined by the logic device isolation film 115 that fills the logic device isolation trench 115T. The plurality of dummy active regions 119 may not have the sidewall recesses 119SRs shown in FIGS. 8A and 9.

For example, in the process of forming the plurality of first trimming spaces TRH shown in FIGS. 6A and 6B, when forming the plurality of first trimming spaces TRH in only a portion corresponding to the region opening MKO shown in FIGS. 3A and 3B, the plurality of dummy active regions 119 may be formed so as not to have the sidewall recesses 119SR shown in FIGS. 8A and 9.

Figure 11A:
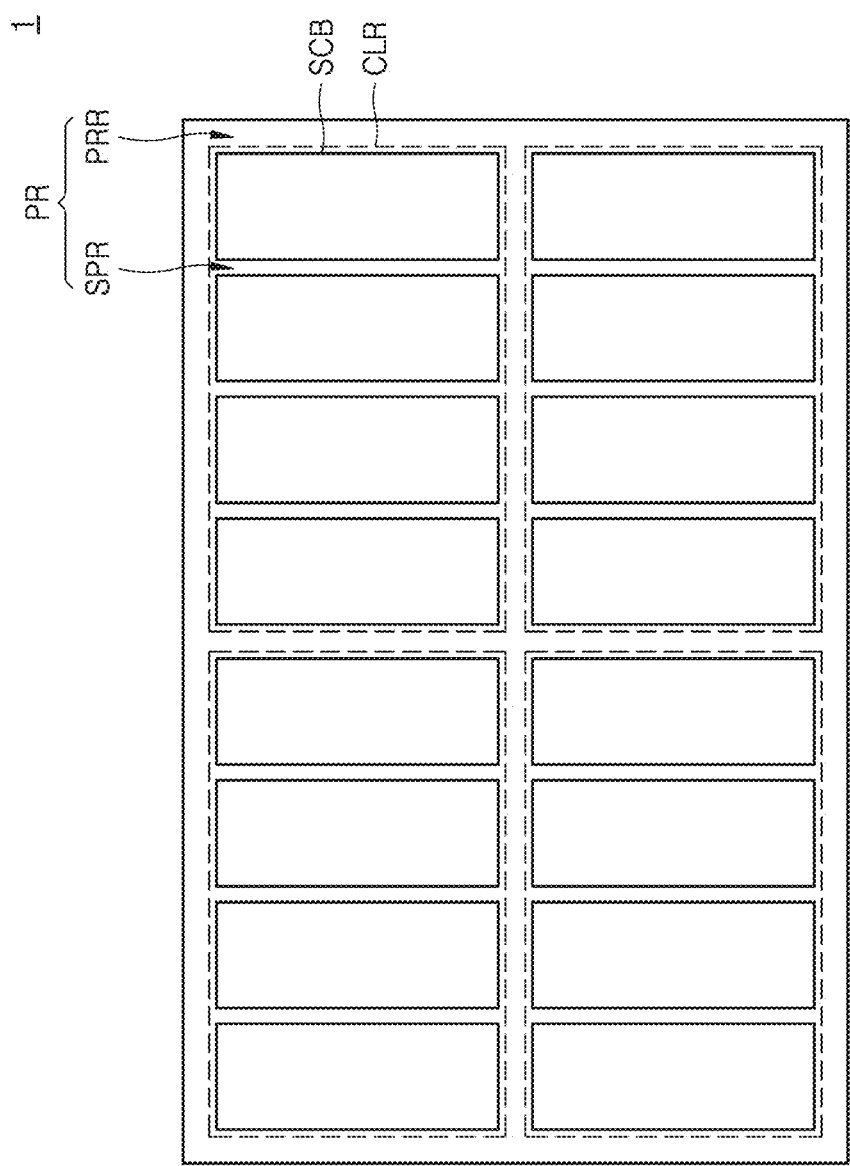
FIG. 11A is a block diagram for explaining a semiconductor memory device according to some example embodiments of inventive concepts.
Figure 11B:
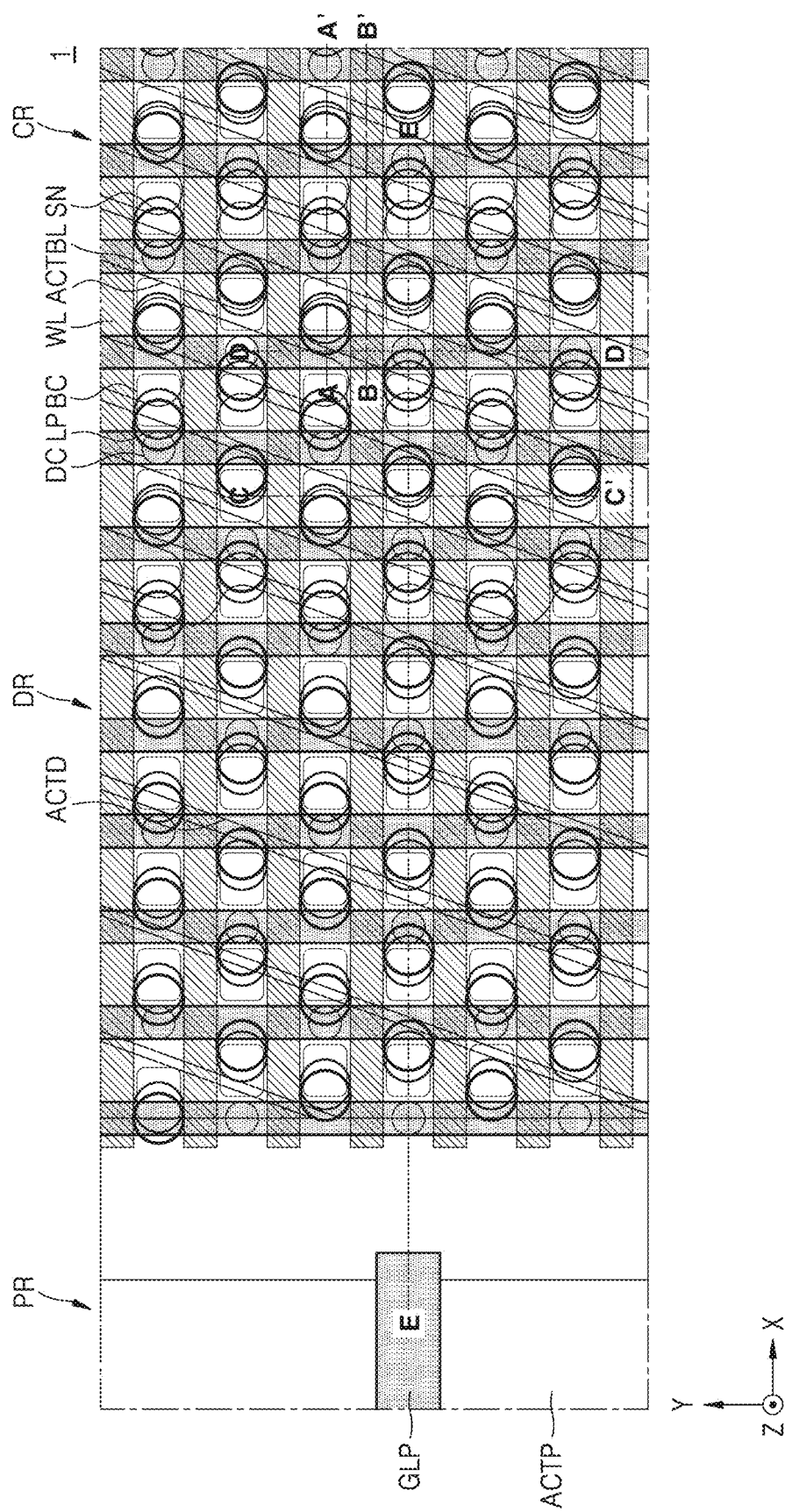
FIG. 11B is a schematic planar layout for explaining main components of a semiconductor memory device according to some example embodiments of inventive concepts.

FIG. 11A is a block diagram for explaining a semiconductor memory device according to some example embodiments of inventive concepts, and FIG. 11B is a schematic planar layout for explaining main components of a semiconductor memory device according to some example embodiments of inventive concepts.

Referring to FIG. 11A, a semiconductor memory device 1 may include a cell region CLR in which memory cells are disposed and a main peripheral region PRR surrounding the cell region CLR.

According to some example embodiments of inventive concepts, sub-peripheral regions SPR that distinguish cell blocks SCB from each other may be included in the cell region CLR. A plurality of memory cells may be disposed in the cell block SCB. In the present specification, the cell block SCB may mean a region where the memory cells are regularly arranged at a uniform interval, and the cell block SCB may be referred to as a sub-cell block.

Logic cells, such as row and/or column decoders/multiplexers, etc., and/or other components such as sense amplifiers, may be disposed in the main peripheral region PRR and in the sub-peripheral region SPR for transmitting and/or receiving electrical signals to and from the memory cells. In some example embodiments, the main peripheral region PRR may be referred to as a peripheral circuit region and the sub-peripheral region SPR may be referred to as a core circuit region. The peripheral region PR may include the main peripheral region PRR and the sub-peripheral region SPR. For example, the peripheral region PR may be a core and peripheral circuit region including the peripheral circuit region and the core circuit region. In some example embodiments, at least a portion of the sub-peripheral region SPR may be provided only as a space for distinguishing the cell blocks SCB from each other.

For example, the cell blocks SCB may be a region where the plurality of active regions 118 described through FIGS. 1A to 10 may be disposed, and the peripheral region PR may be a region where the at least one logic active region 117 described through FIGS. 1A to 10 may be disposed. In some example embodiments, the plurality of dummy active regions 119 described through FIGS. 1A to 10 may be disposed on edge portions of the cell blocks SCB adjacent to the peripheral region PR.

Referring to FIG. 11B, the semiconductor memory device 1 may include the memory cell region CR and the peripheral region PR. The semiconductor memory device 1 may further include a dummy cell region DR between the memory cell region CR and the peripheral region PR. The dummy cell region DR may surround the memory cell region CR. The semiconductor memory device 1 may include a plurality of active regions ACT formed in the memory cell region CR, and a plurality of dummy active regions ACTD formed in the dummy cell region DR, and at least one logic active region ACTP formed in the peripheral region PR. The memory cell region CR and the dummy cell region DR may be the cell block SCB in which the plurality of memory cells shown in FIG. 11A are disposed, and the peripheral region (PR) may be the peripheral region PR including the main peripheral region PRR and the sub-peripheral regions SPR shown in FIG. 11A. The dummy cell region DR may be disposed in the edge portions of the cell blocks SCB adjacent to the peripheral region PR.

In some example embodiments, the plurality of active regions ACT to be disposed in the memory cell region CR may be arranged to have the long axis in the diagonal direction relative to the first horizontal direction (the X direction) and the second horizontal direction (the Y direction). In some example embodiments, the plurality of dummy active regions ACTD to be disposed in the dummy cell region DR may be arranged to have the long axis in the diagonal direction relative to the first horizontal direction (the X direction) and the second horizontal direction (the Y direction). The plurality of active regions ACT may include the plurality of active regions 118 illustrated in FIGS. 7A to 10. The plurality of dummy active regions ACTD may include the plurality of dummy active regions 119 illustrated in FIGS. 7A to 10. The plurality of dummy active regions ACTD shown in FIG. 11B does not show the sidewall recesses 119SR in the plurality of dummy active regions 119 shown in FIGS. 8A and 9, but this is for the convenience of the illustration, the plurality of dummy active regions ACTD may have the sidewall recesses 119SR in the plurality of dummy active regions 119 shown in FIG. 8A or the plurality of dummy active regions 119 shown in FIG. 9.

A plurality of word lines WL may extend parallel to each other in the first horizontal direction (the X direction) across the plurality of active regions ACT in the memory cell region CR. In some example embodiments, the plurality of word lines WL may extend parallel to each other in the first horizontal direction (the X direction) across the plurality of active regions ACT and the plurality of dummy active regions ACTD in the memory cell region CR and the dummy cell region DR. On the plurality of word lines WL, a plurality of bit lines BL may extend parallel to each other in the second horizontal direction (the Y direction) that intersects the first horizontal direction (the X direction).

In some example embodiments, a plurality of buried contacts BC may be formed between two adjacent bit lines BL of the plurality of bit lines BL. In some example embodiments, the plurality of buried contacts BC may be arranged in a line in the first horizontal direction (the X direction) and the second horizontal direction (the Y direction).

A plurality of landing pads LP may be formed on the plurality of buried contacts BC. The plurality of landing pads LP may be arranged to be at least partially overlapped with the plurality of buried contacts BC. In some example embodiments, the plurality of landing pads LP may extend to an upper portion of any one of the two bit lines BL adjacent to each other.

A plurality of storage nodes SN may be formed on the plurality of landing pads LP. The plurality of storage nodes SN may be formed on the upper portion of the plurality of bit lines BL. The plurality of storage nodes SN may be or include a lower electrode of a plurality of capacitors, respectively; however, example embodiments are not limited thereto, and the plurality of storage nodes SN may be or may include other components such as a memristor and/or a device having a hysteresis I-V characteristic. The storage node SN may be connected to the active region ACT through the landing pad LP and the buried contact BC.

At least one gate line pattern GLP may be disposed on the at least one logic active region ACTP in the peripheral region PR. FIG. 11B shows that the at least one gate line pattern GLP extends in parallel in the first horizontal direction (the X direction) on the logic active region ACTP, and has a constant width in the second horizontal direction (the Y direction), but is not limited thereto. For example, each of the at least one gate line pattern GLP may have a variety of widths, and the widths thereof may change. Alternatively or additionally, each of the at least one gate line pattern GLP may extend in various directions or may be curved.

Figure 15A:
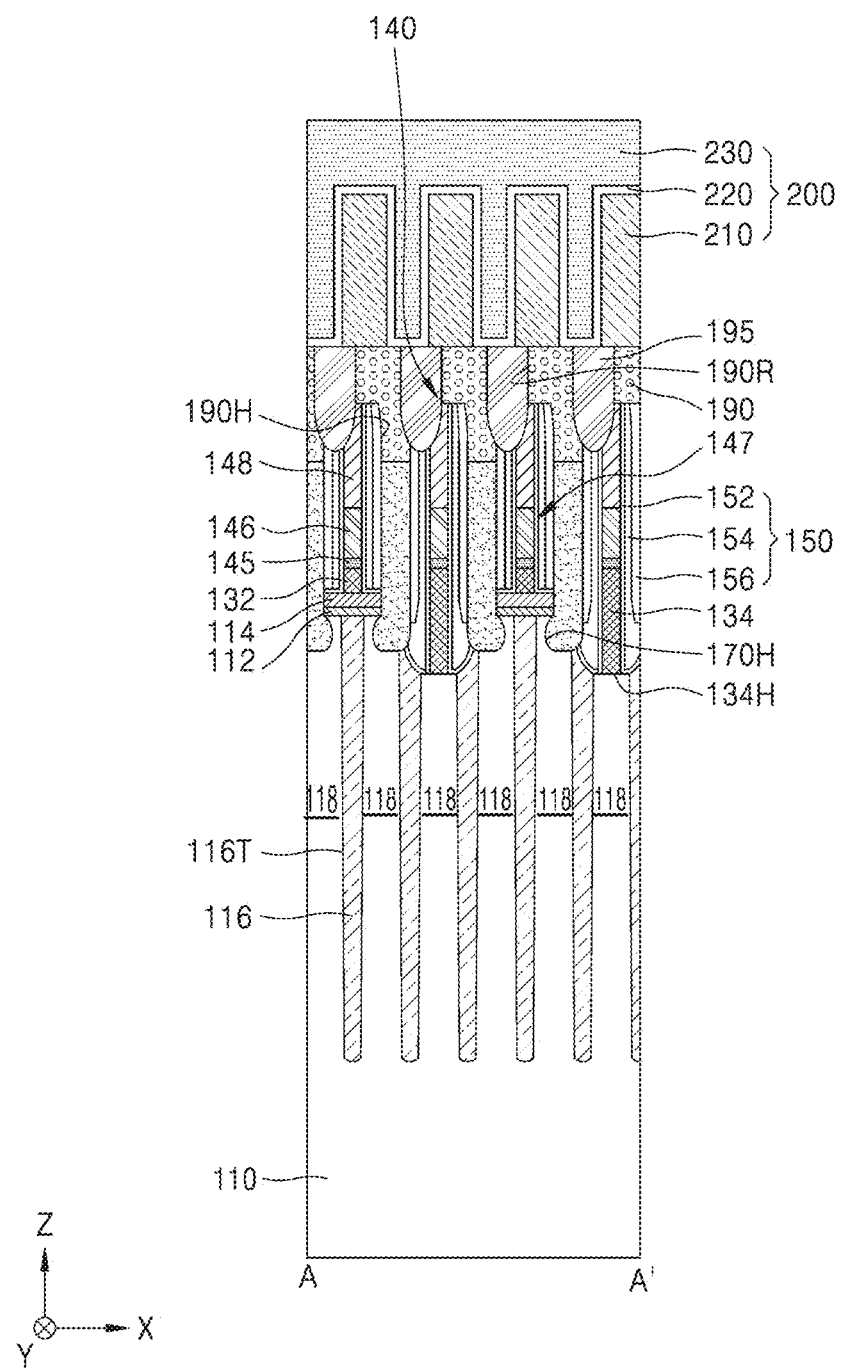
FIGS. 15A to 15E are cross-sectional views illustrating a semiconductor memory device according to some example embodiments of inventive concepts.
Figure 15B:
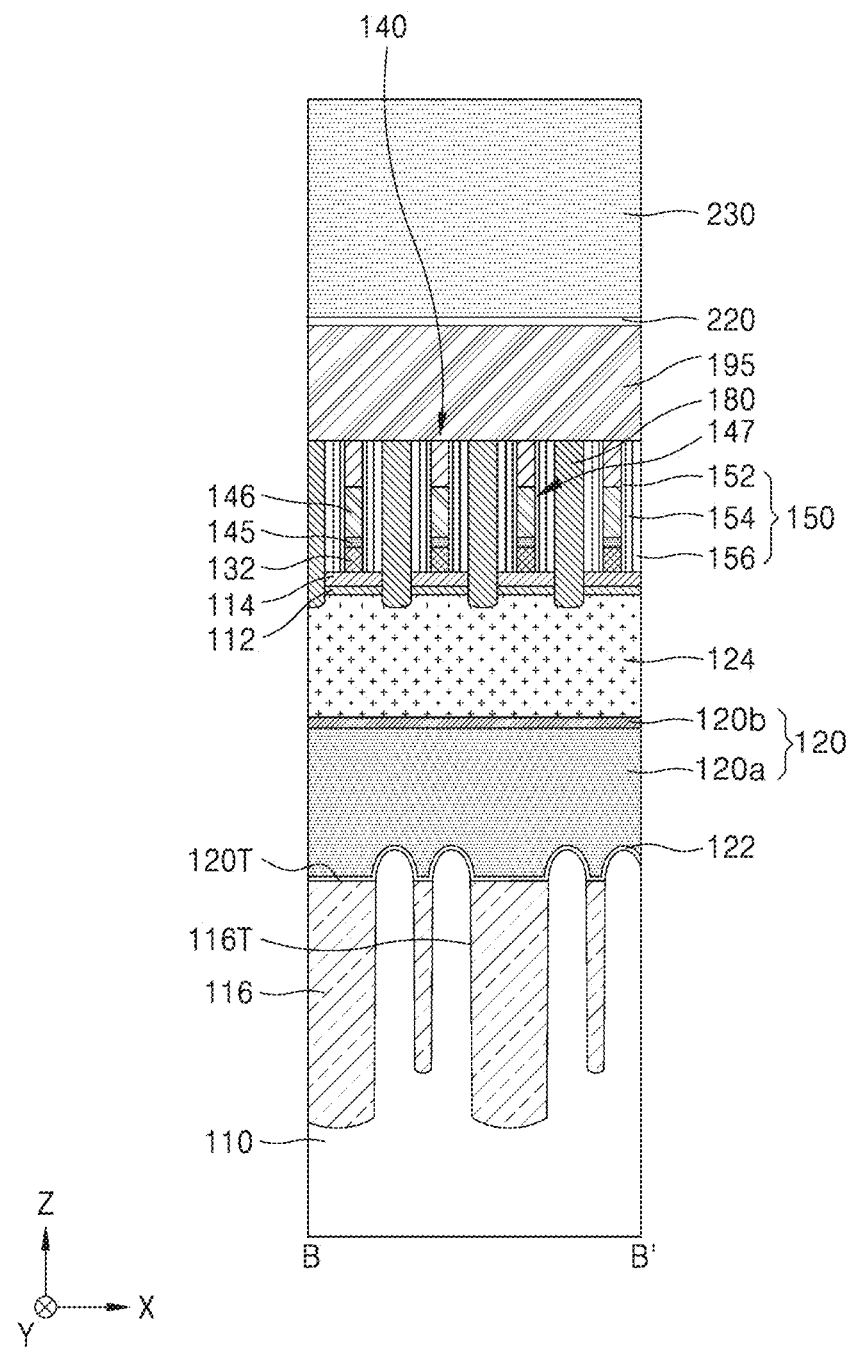
Figure 15C:
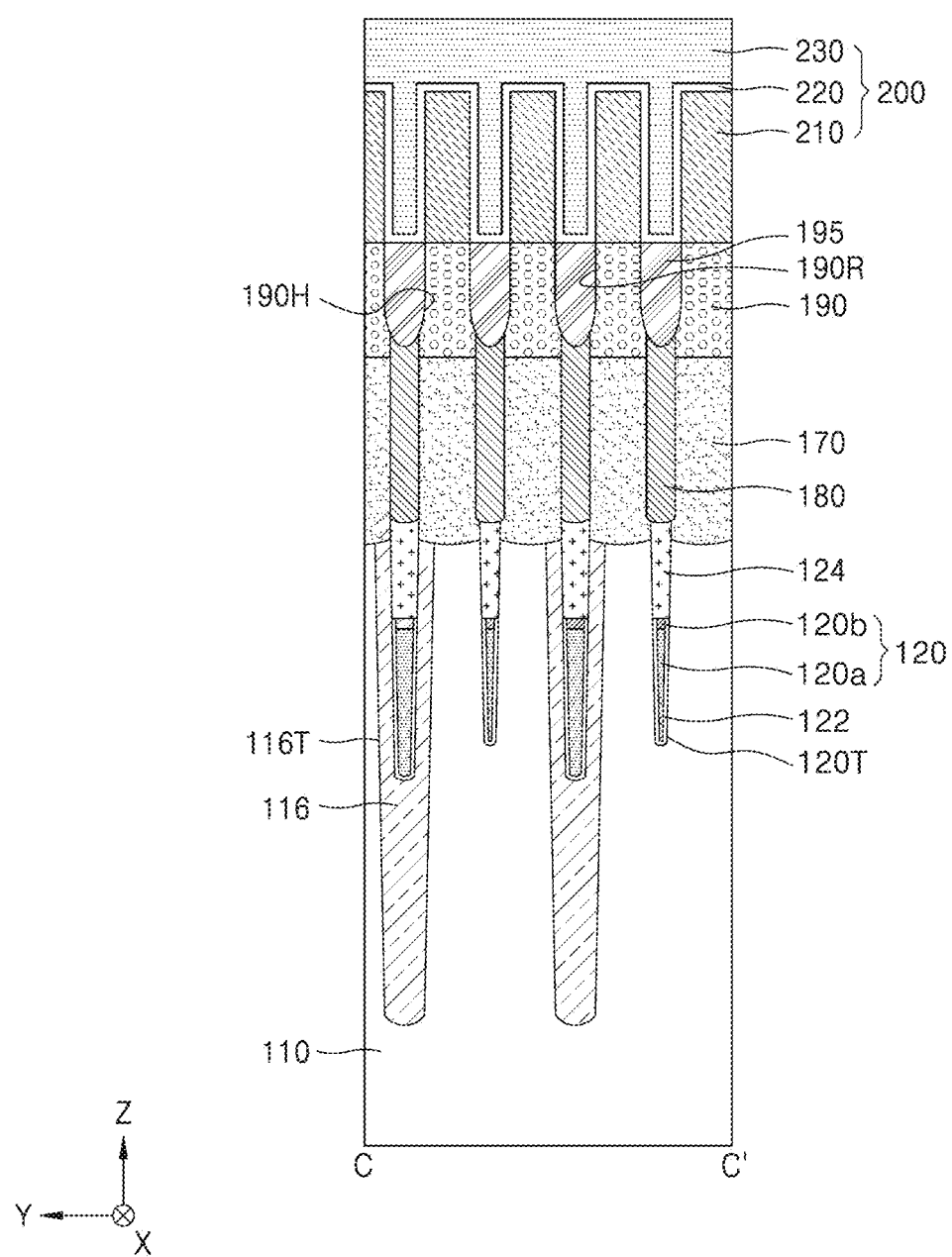
Figure 15D:
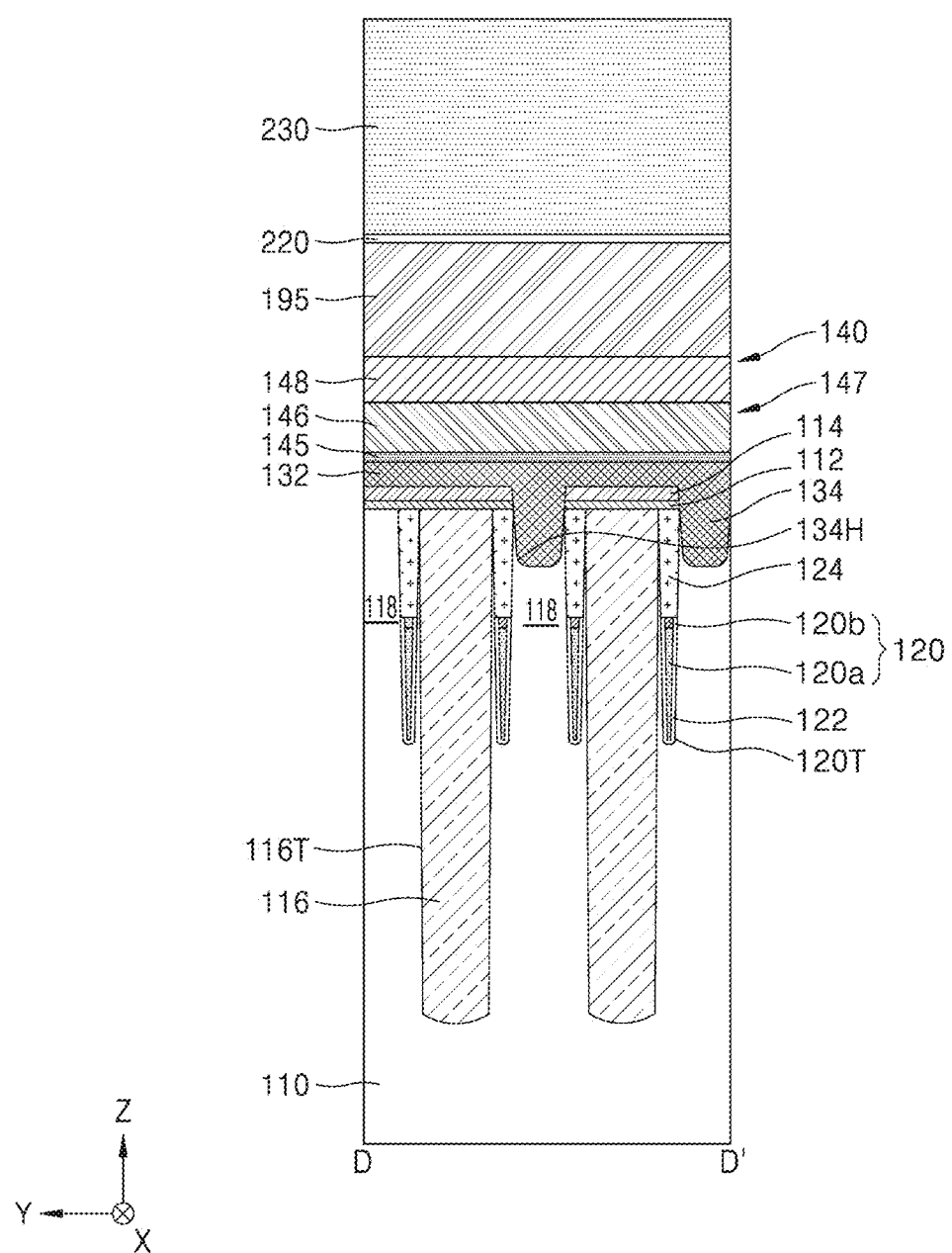
Figure 15E:
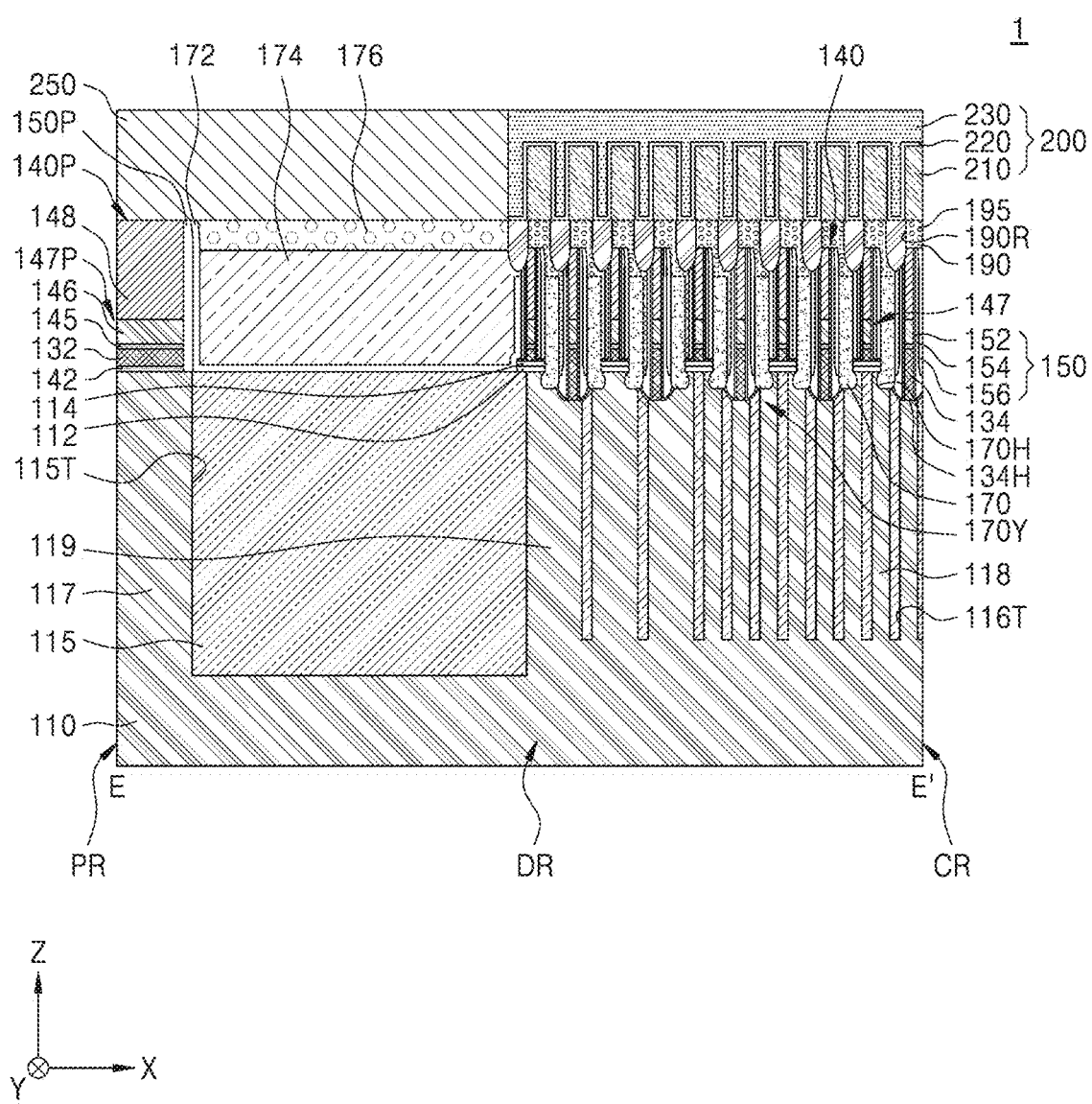

In FIG. 11B, for the convenience of the illustration, other components except the at least one logic active region ACTP and the at least one gate line pattern GLP is omitted in the peripheral region PR. In some example embodiments, the at least one gate line pattern GLP may extend outside the logic active region ACTP, that is, onto the logic device isolation film 115 as shown in FIG. 15E.

The at least one gate line pattern GLP may be formed at the same level as the plurality of bit lines BL. In some example embodiments, the at least one gate line pattern GLP may be made of the same material as the plurality of bit lines BL, or at least a portion therebetween may be made of the same material. For example, all or part of the process for forming the at least one gate line pattern GLP may be the same process as all or part of the process for forming the plurality of bit lines BL.

Figure 12A:
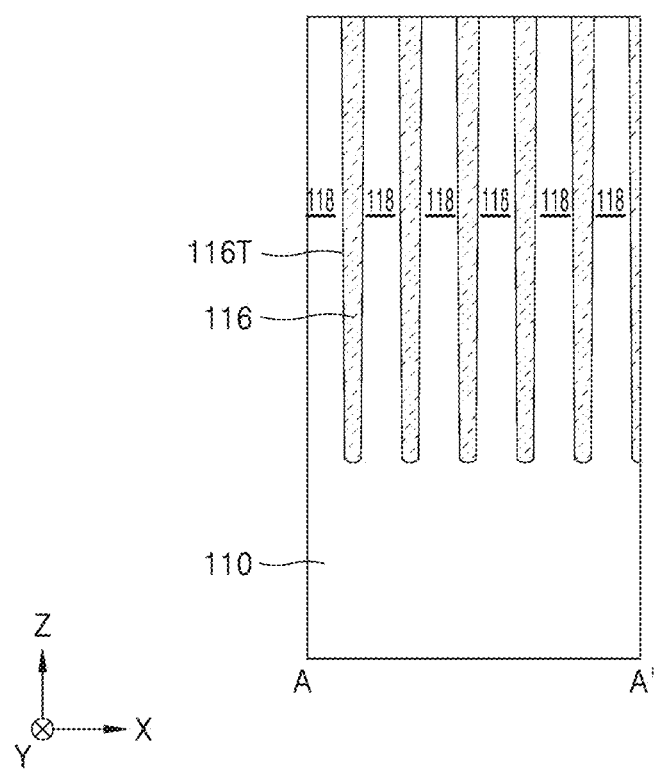
FIGS. 12A to 12D, 13A to 13D, and 14A to 14D are cross-sectional views sequentially illustrating a manufacturing method of a semiconductor memory device according to some example embodiments of inventive concepts.
Figure 12B:
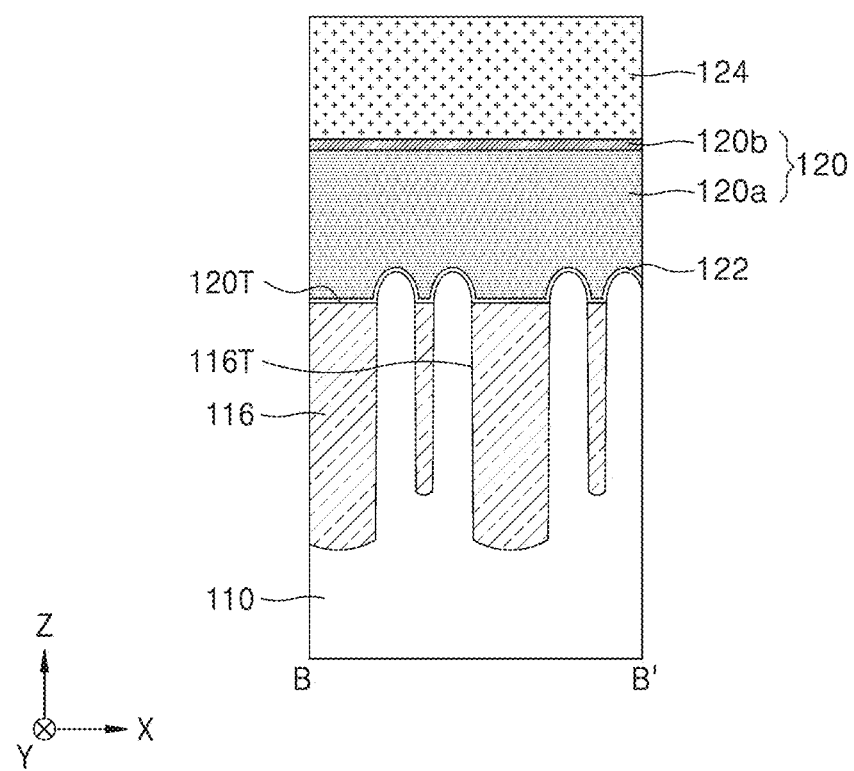
Figure 12C:
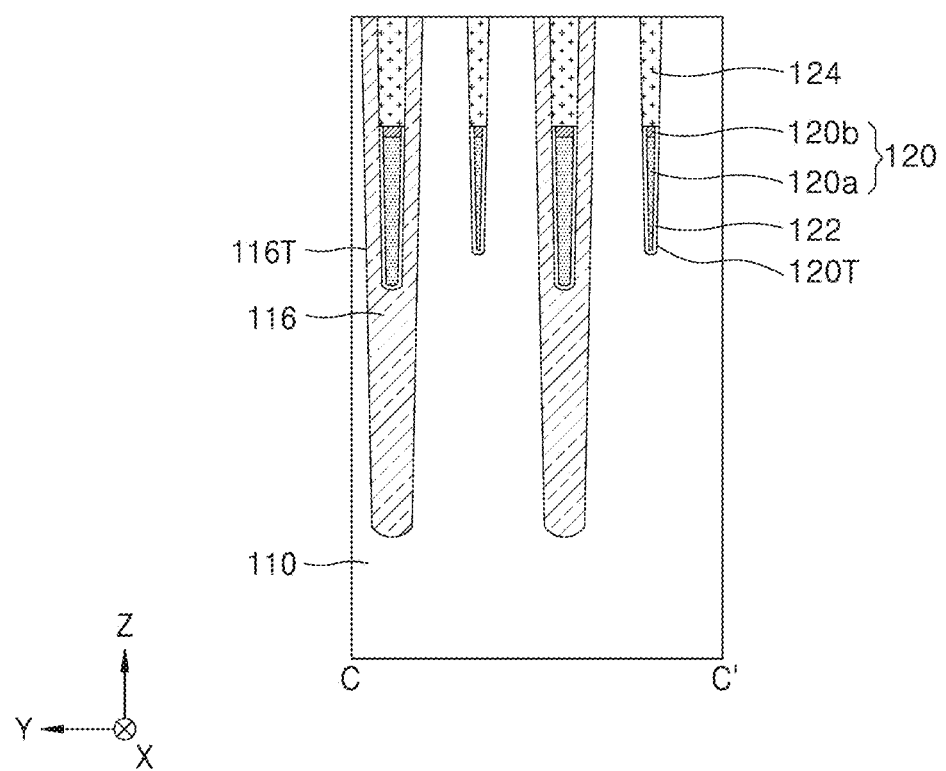
Figure 12D:
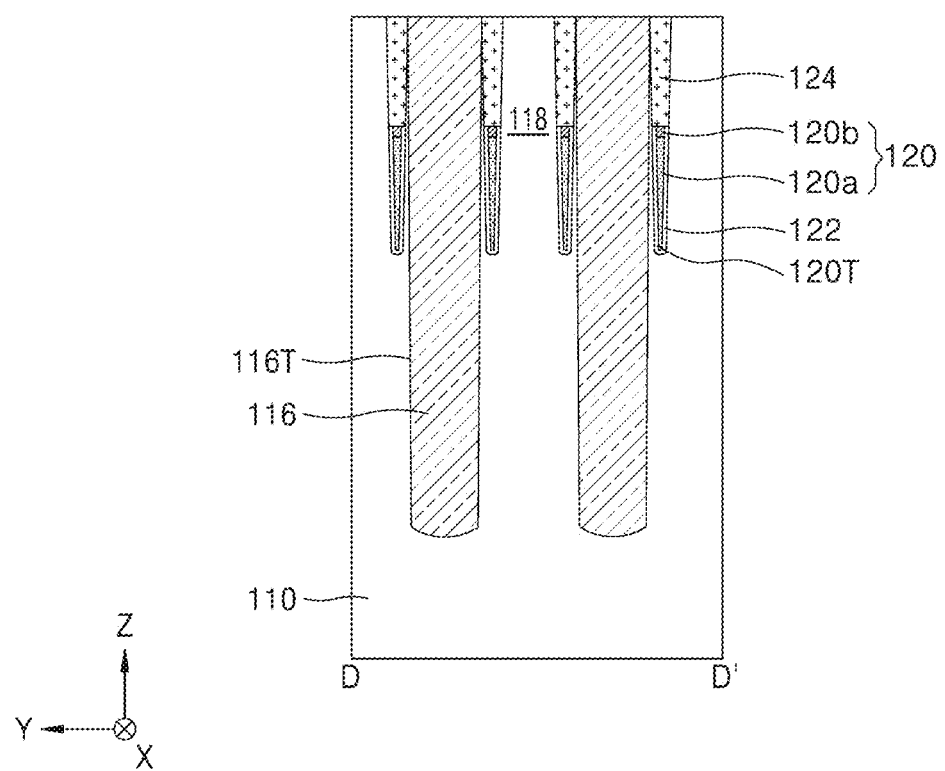
Figure 13A:
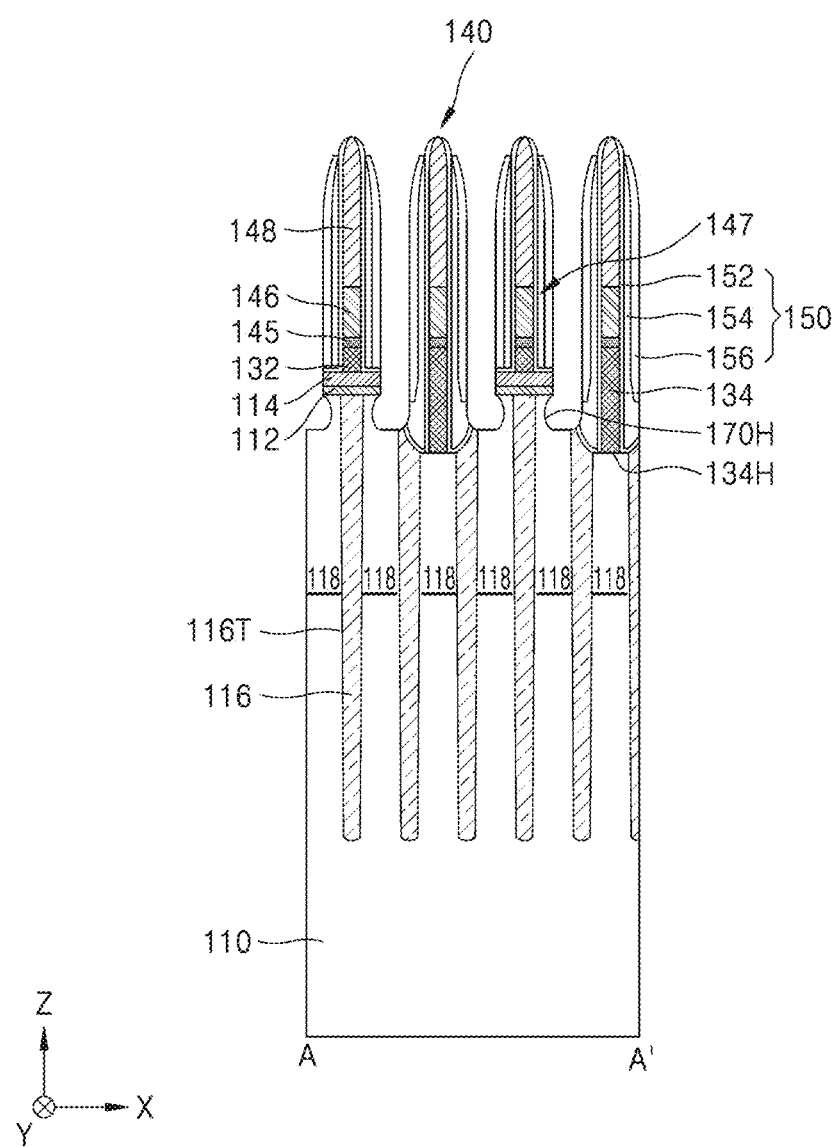
Figure 13B:
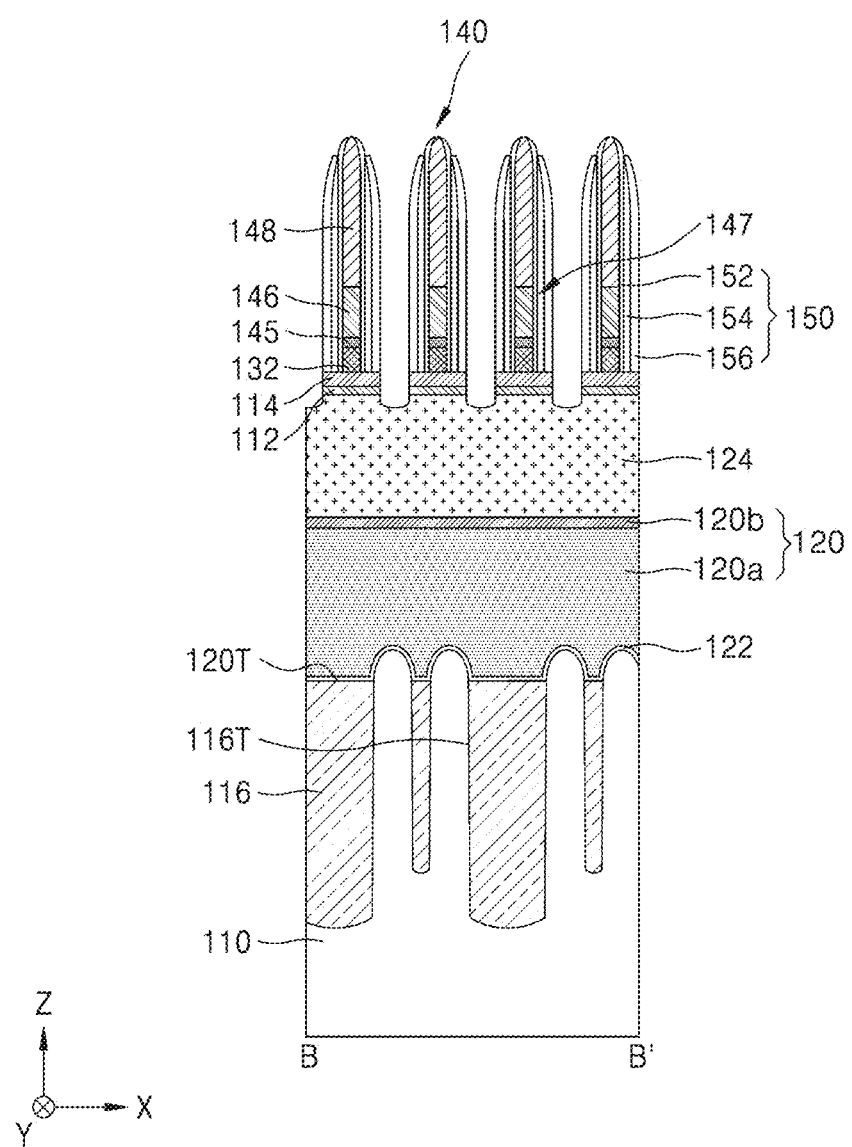
Figure 13C:
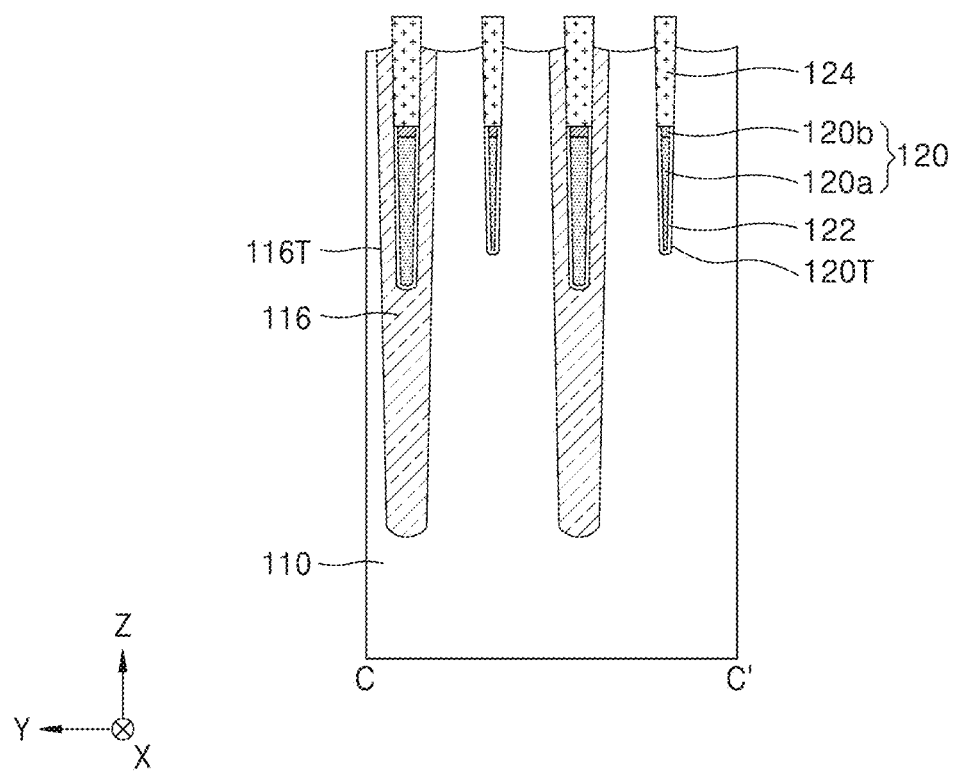
Figure 13D:
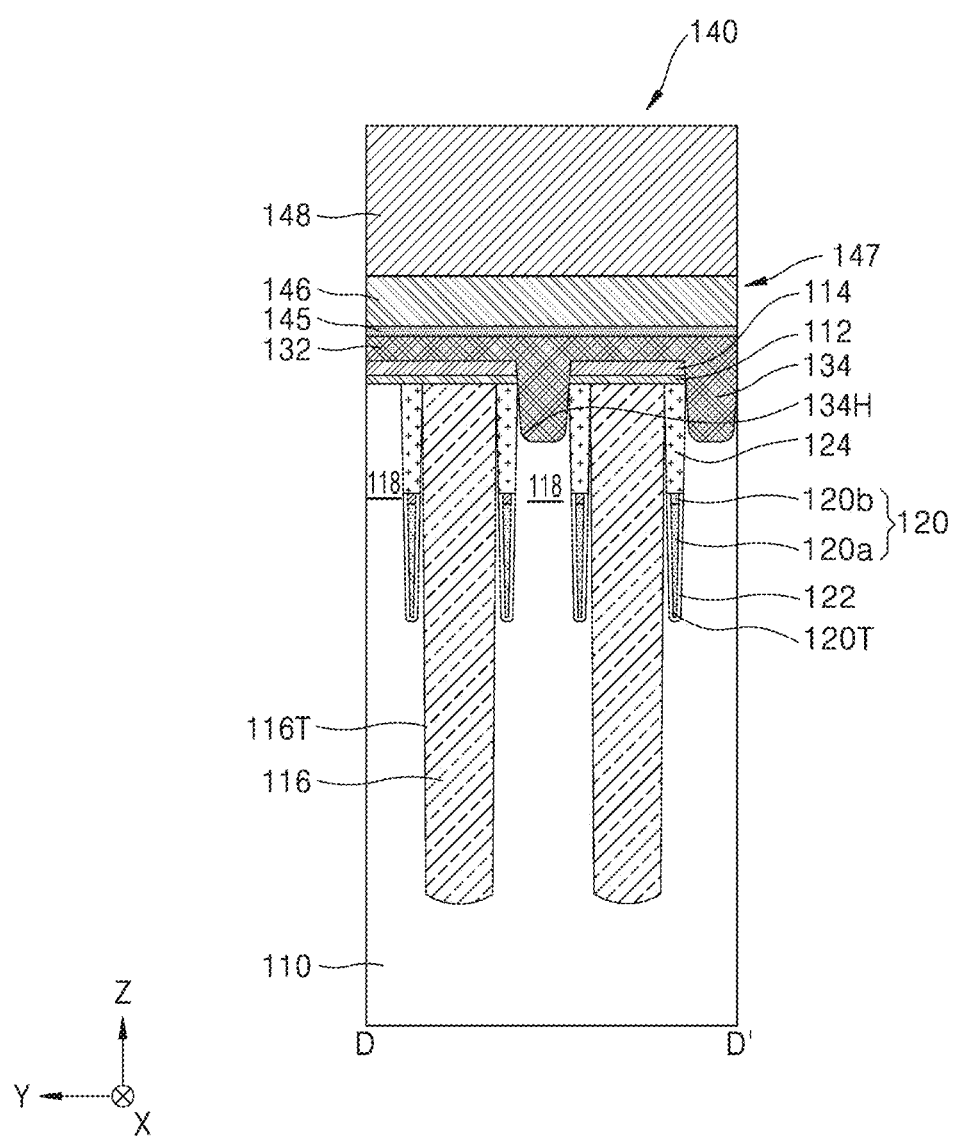
Figure 14A:
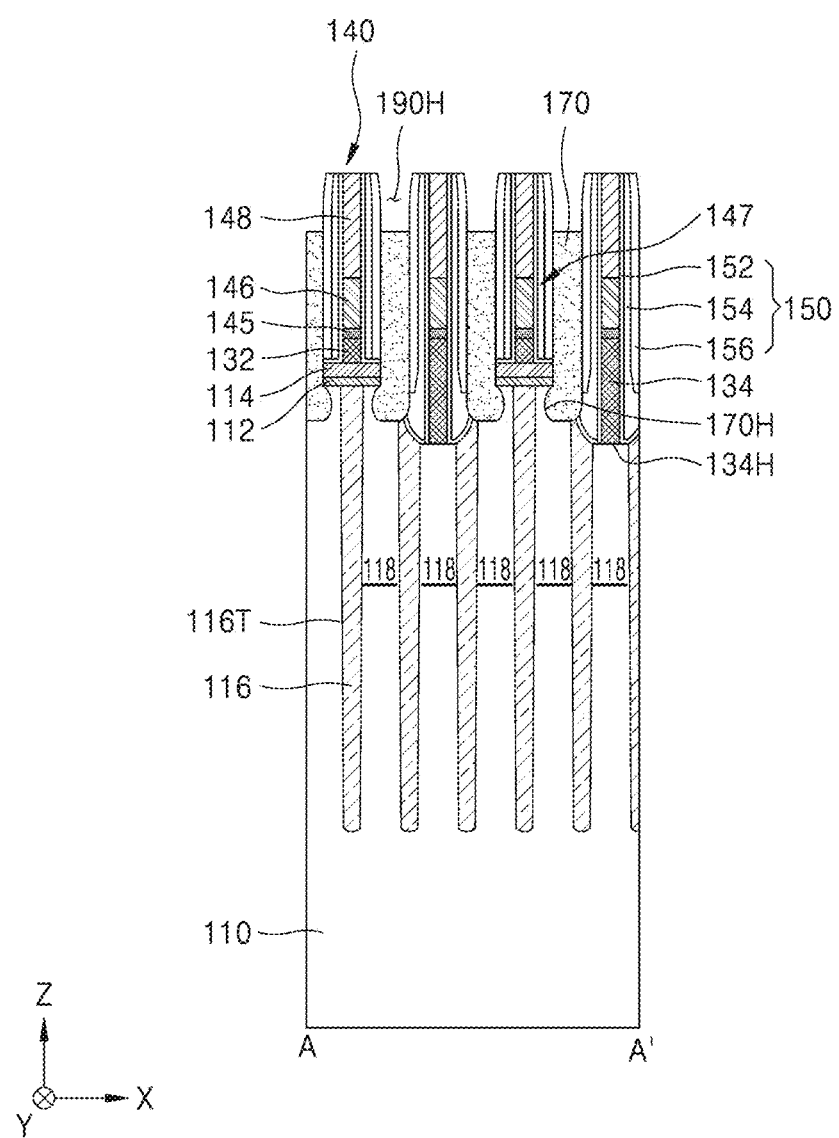
Figure 14B:
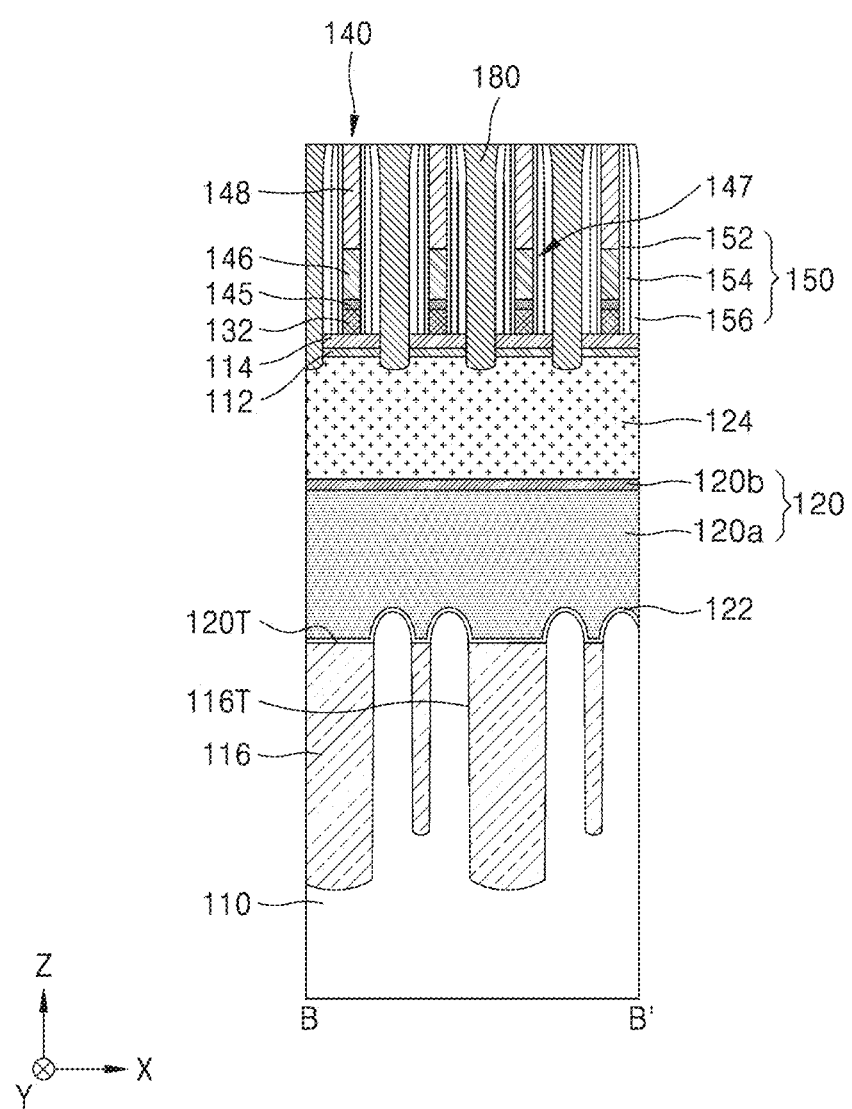
Figure 14C:
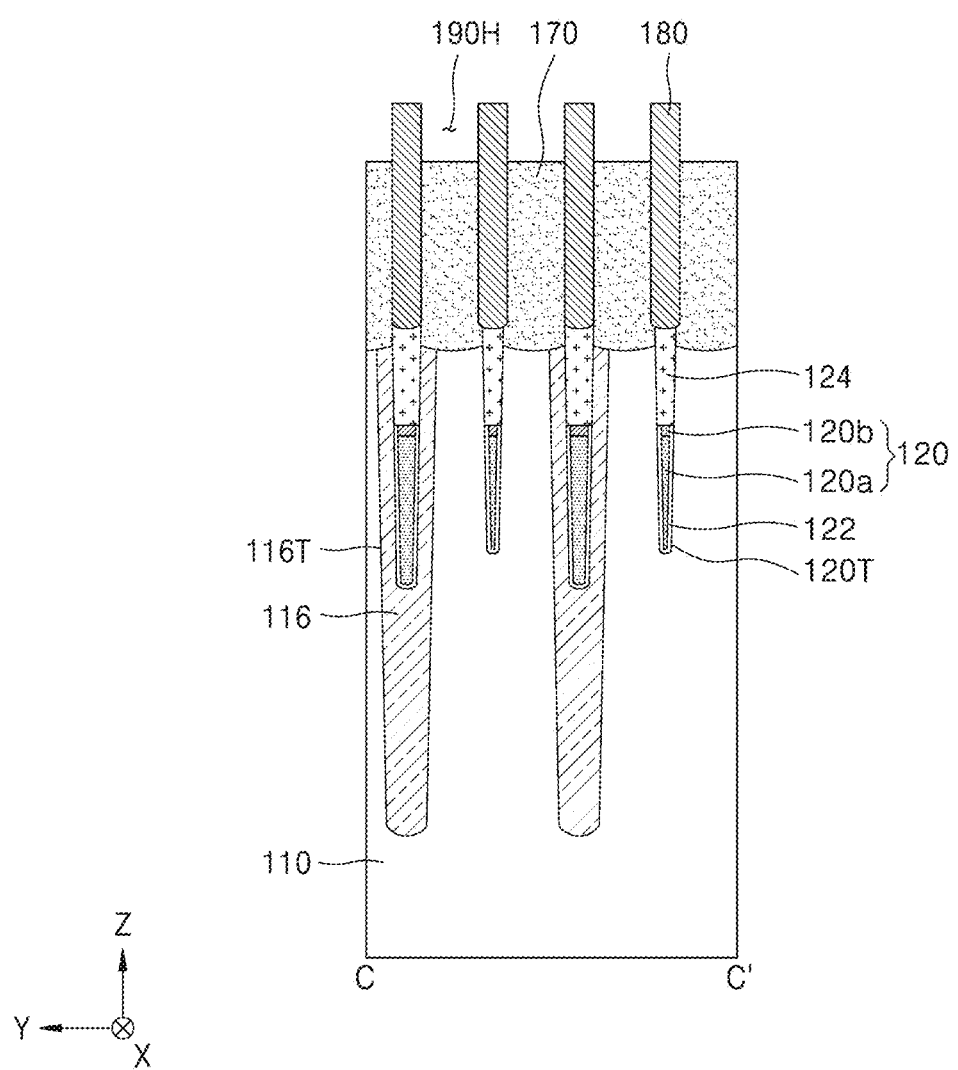
Figure 14D:
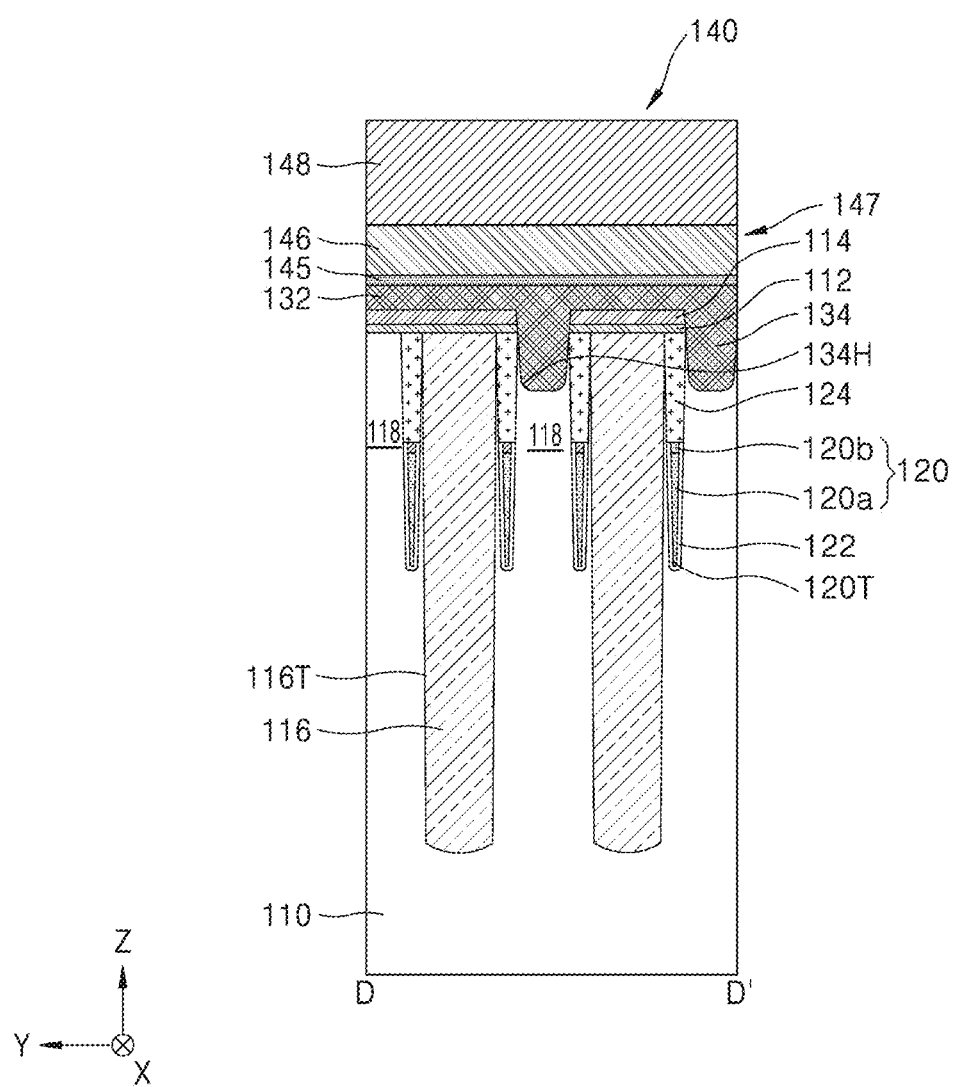

FIGS. 12A to 12D, 13A to 13D, and 14A to 14D are cross-sectional views sequentially illustrating a fabrication method of a semiconductor memory device according to some example embodiments of inventive concepts, and FIGS. 15A to 15E are cross-sectional views illustrating a semiconductor memory device according to some example embodiments of inventive concepts. Specifically, FIGS. 12A, 13A, and 14A are cross-sectional views taken along a line A-A' of FIG. 11B, FIGS. 12B, 13B, and 14B are cross-sectional views taken along a line B-B' of FIG. 11B, FIGS. 12C, 13C, and 14C are cross-sectional views taken along a line C-C' of FIG. 11B, FIGS. 12D, 13D, and 14D are cross-sectional views taken along a line D-D' of FIG. 11B, and FIGS. 15A, 15B, 15C, 15D, and 15E are cross-sectional views respectively taken along lines A-A', B-B', C-C', D-D', and E-E' of FIG. 11B. Although only the memory cell region CR shown in FIG. 11B will be described with respect to FIGS. 12A to 15D, the same components as the memory cell region CR may also be formed through the same process for the dummy cell region DR shown in FIG. 11B. The peripheral region PR shown in FIG. 11B will be described with respect to FIG. 15E.

Referring to FIGS. 12A to 12D together, a plurality of word line trenches 120T may be formed in the substrate 110 on which the plurality of active regions 118 defined by the device isolation film 116 is formed. The plurality of word line trenches 120T may extend in the first horizontal direction (the X direction) parallel to each other, each of the plurality of word line trenches 120T may have a line shape that crosses the active region 118 and is disposed at substantially equal intervals in the second horizontal direction (the Y direction). In some example embodiments, a step may be formed on bottom surfaces of the plurality of word line trenches 120T. In some example embodiments, the plurality of word line trenches 120T may be formed by removing portions of the substrate 110 using a mask insulating layer (not shown) as an etching mask.

After cleaning the result in which the plurality of word line trenches 120T are formed, a plurality of gate dielectric films 122, a plurality of word lines 120, and a plurality of buried insulating films 124 may be formed in sequence. A plurality of word lines 120 may constitute/correspond to the plurality of word lines WL illustrated in FIG. 11B. The plurality of word lines 120 may extend in the first horizontal direction (the X direction) parallel to each other, each of the plurality of word lines 120 may have a line shape that crosses the active region 118 and is disposed at substantially equal intervals in the second horizontal direction (the Y direction). An upper surface of each of the plurality of word lines 120 may be located at a lower level than an upper surface of the substrate 110. Bottom surfaces of the plurality of word lines 120 may have a concavo-convex shape, and a transistor of a saddle fin structure (e.g., a saddle FinFET) may be formed in the plurality of active regions 118.

As used herein, terms of a level or a vertical level refer to a height in a vertical direction (a Z direction) with respect to a main surface or an upper surface of the substrate 110. For example, positioning at the same level may mean that the height in the vertical direction (the Z direction) with respect to the main surface or the upper surface of the substrate 110 is the same between comparison objects, positioning at a constant level may mean that the height in the vertical direction (the Z direction) with respect to the main surface or the upper surface of the substrate 110 is at the constant position, and positioning at a low/high level may mean that the height in the vertical direction (the Z direction) with respect to the main surface or the upper surface of the substrate 110 is low/high position.

Each of the plurality of word lines 120 may fill a lower portion of the plurality of word line trenches 120T. Each of the plurality of word lines 120 may include a stacked structure of a lower word line layer 120a and an upper word line layer 120b. For example, the lower word line layer 120a may conformally cover an inner wall and a bottom surface of the lower portion of the word line trench 120T with a gate dielectric layer 122 therebetween. For example, the upper word line layer 120b may cover the lower word line layer 120a and fill the lower portion of the word line trench 120T. In some example embodiments, the lower word line layer 120a may include metal material or conductive metal nitride such as at least one of Ti, TiN, Ta, or TaN. In some example embodiments, the upper word line layer 120b may include, for example, doped polysilicon, metal material such as W, conductive metal nitride such as WN, TiSiN, WSiN, or combinations thereof.

In some example embodiments, after forming the plurality of word lines 120 or after forming the plurality of word lines 120, impurity ions such as at least one of boron, carbon, phosphorus, or arsenic may be injected/implanted into portions of the active regions 118 of the substrate 110 that are on both sides of the plurality of word lines 120, and thus source regions and drain regions may be formed in the plurality of active regions 118.

The gate dielectric film 122 may cover the inner wall and the bottom surface of the word line trench 120T. In some example embodiments, the gate dielectric film 122 may extend from between the word line 120 and the word line trench 120T to between the buried insulation film 124 and the word line trench 120T. The gate dielectric film 122 may include at least one selected from silicon oxide, silicon nitride, silicon oxynitride, oxide/nitride/oxide (ONO), or high-k dielectric material having a higher dielectric constant than silicon oxide. For example, the gate dielectric film 122 may have the dielectric constant of about 10 to about 25. In some example embodiments, the gate dielectric film 122 may include at least one material selected from hafnium oxide (HfO), hafnium silicate (HfSiO), hafnium oxynitride (HfON), hafnium silicon oxynitride (HfSiON), rantanium oxide (LaO), rantanium aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (ALO), or lead scandium tantalum oxide (PbScTaO). For example, the gate dielectric film 122 may include $HfO_2$, $Al_2O_3$, $HfAlO_3$, $Ta_2O_3$, or $TiO_2$.

The plurality of buried insulating films 124 may fill an upper portion of the plurality of word line trenches 120T. An upper surface of the plurality of buried insulating films 124 may be located at substantially the same level as the upper surface of the substrate 110. The buried insulating film 124 may include at least one material film selected from silicon oxide, silicon nitride, silicon oxynitride, or combinations thereof. For example, the buried insulating film 124 may include silicon nitride.

FIGS. 13A to 13D, insulating film patterns 112 and 114 that cover the device isolation film 116, the plurality of active regions 118, and the plurality of buried insulating films 124 may be formed. For example, the insulating film patterns 112 and 114 may include silicon oxide, silicon nitride, silicon oxynitride, metallic dielectric, or combinations thereof. In some example embodiments, the insulating film patterns 112 and 114 may include a stacked structure of a plurality of insulating films including a first insulating film pattern 112 and a second insulating film pattern 114. In some example embodiments, the first insulating film pattern 112 may include silicon oxide, and the second insulating film pattern 114 may include silicon oxynitride. In some example embodiments, the first insulating film pattern 112 may include non-metallic dielectric, and the second insulating film pattern 114 may include metallic dielectric. In some example embodiments, the second insulating film pattern 114 may be formed thicker than the first insulating film pattern 112. For example, the first insulating film pattern 112 may be formed with a thickness of about 50 Å (5.0 nm) to about 90 Å (9.0 nm), and the second insulating film pattern 114 may be thicker than the first insulating film pattern 112, with the thickness of about 60 Å (6.0 nm) to about 100 Å (10.0 nm).

Thereafter, a conductive semiconductor layer may be formed on the insulating film patterns 112 and 114, then a direct contact hole 134H that exposes the source region in the active region 118 through the conductive semiconductor layer and the insulating film patterns 112 and 114 may be formed, and a conductive layer for the digit-line contact or the direct contact that fills the direct contact hole 134H may be formed. In some example embodiments, the direct contact hole 134H may extend into the active region 118, that is, into the source region. The conductive semiconductor layer may include, for example, doped polysilicon (e.g. N-type polysilicon). The conductive layer for the direct contact may include, for example, doped polysilicon (e.g. N-type polysilicon). In some example embodiments, the conductive layer for the direct contact may include an epitaxial silicon layer.

On the conductive semiconductor layer and the conductive layer for the direct contact, a metal-based conductive layer for forming a bit line structure 140, and an insulating capping layer may be sequentially formed. In some example embodiments, the metal-based conductive layer may include a stacked structure of the first metal-based conductive layer and the second metal-based conductive layer. The first metal-based conductive layer, the second metal-based conductive layer, and the insulating capping layer may be etched to form a plurality of bit lines 147 in a line shape that include a stacked structure of a first metal-based conductive pattern 145 and a second metal conductive pattern 146 and a plurality of insulating capping lines 148.

In some example embodiments, the first metal-based conductive pattern 145 may include titanium nitride (TiN) and/or TSN (Ti—Si—N), and the second metal-based conductive pattern 146 may include tungsten (W) and/or tungsten silicide (WSix). In some example embodiments, the first metal-based conductive pattern 145 may perform the function of a diffusion barrier. In some example embodiments, the plurality of insulating capping lines 148 may include silicon nitride.

One bit line 147 and one insulating capping line 148 covering the one bit line 147 may constitute one bit line structure 140. A plurality of bit line structures 140, each one of which being constituted by the bit line 147 and the insulating capping line 148, may extend parallel to each other in the second horizontal direction (the Y direction) parallel to the main surface of the substrate 110. The plurality of bit lines 147 may constitute the plurality of bit lines BL illustrated in FIG. 11B. In some example embodiments, the bit line structure 140 may further include a conductive semiconductor pattern 132, which is a portion of the conductive semiconductor layer disposed between the insulating film patterns 112 and 114 and the first metal-based conductive pattern 145.

In the etching process for forming the plurality of bit lines 147, a portion of the conductive semiconductor layer and a portion of the conductive layer for the direct contact that do not vertically overlap the bit line 147 may be removed together/simultaneously/concurrently through the etching process, to form a plurality of conductive semiconductor pattern 132 and a plurality of direct contact conductive patterns 134. At this time, the insulating film patterns 112 and 114 may perform the function of an etch stop film in the etching process for forming the plurality of bit lines 147, the plurality of conductive semiconductor patterns 132, and the plurality of direct contact conductive patterns 134. The plurality of direct contact conductive patterns 134 may constitute the plurality of direct contacts DC illustrated in FIG. 11B. The plurality of bit lines 147 may be electrically connected to the plurality of active regions 118 through the plurality of direct contact conductive patterns 134.

Both sidewalls of each of the plurality of bit line structures 140 may be covered with an insulating spacer structure 150. The plurality of insulating spacer structures 150 may respectively include a first insulating spacer 152, a second insulating spacer 154, and a third insulating spacer 156. The second insulating spacer 154 may include a material with a lower dielectric constant than the first insulating spacer 152 and the third insulating spacer 156. In some example embodiments, the first insulating spacer 152 and the third insulating spacer 156 may include nitride, and the second insulating spacer 154 may include oxide. In some example embodiments, the first insulating spacer 152 and the third insulating spacer 156 may include nitride, and the second insulating spacer 154 may include material having an etch selectivity for the first insulating spacer 152 and the third insulating spacer 156. For example, when the first insulating spacer 152 and the second insulating spacer 156 are made of nitride, the second insulating spacer 154 may be made of oxide and then may be removed in the subsequent process to be an air spacer. In some example embodiments, the insulating spacer structure 150 may be composed of the second insulating spacer 154 of oxide and a third insulating spacer 156 of nitride.

A plurality of insulating fences 180 may be formed in spaces between the plurality of insulating spacer structures 150 covering both sidewalls of each of the plurality of bit line structures 140. The plurality of insulating fences 180 may be arranged in rows to be spaced apart from each other, while extending along between pairs of insulating spacer structures 150 facing each other among the plurality of insulating spacer structures 150 that cover both sidewalls of the plurality of bit line structures 140, that is, in the second horizontal direction (the Y direction). For example, the plurality of insulating fences 180 may include nitride.

In some example embodiments, the plurality of insulating fences 180 may penetrate the insulating film patterns 112 and 114 to extend into the buried insulating film 124, but are not limited thereto. In some other embodiments, the plurality of insulating fences 180 may penetrates the insulating film patterns 112 and 114 without extending into the buried insulating film 124, or extend into the insulating film patterns 112 and 114 without penetrating the insulating film patterns 112 and 114. In addition, the plurality of insulating fences 180 may be formed so that the plurality of insulating fences 180 is not extended into the insulating film patterns 112 and 114 while lower surfaces of the plurality of insulating fences 180 contact the insulating film patterns 112 and 114.

Between each of the plurality of bit lines 147, a plurality of buried contact holes 170H may be formed between the plurality of insulating fences 147. The plurality of buried contact holes 170H and the plurality of insulating fences 180 may be alternately arranged, while extending along between pairs of insulating spacer structures 150 facing each other among the plurality of insulating spacer structures 150 that cover both sidewalls of the plurality of bit line structures 140, that is, in the second horizontal direction (the Y direction). An internal space of each the plurality of buried contact holes 170H may be defined by the insulating spacer structures 150, the insulating fences 180, and the active region 118, in which the insulating spacer structures 150 may cover the sidewall of each of neighboring two bit lines 147 between neighboring two bit lines 147 among the plurality of bit lines 147.

The plurality of buried contact holes 170H may be formed by removing (etching) portions of the insulating film patterns 112 and 114 and the active region 118 using the plurality of insulating capping lines 148, the plurality of insulating spacer structure 150 covering both sidewalls of each of the plurality of bit line structures 140, and the plurality of insulation fences 180 as the etch mask. In some example embodiments, the plurality of buried contact holes 170H may be formed by firstly removing portions of the insulating film patterns 112 and 114 and the active region 118 using the plurality of insulating capping lines 148, the insulating spacer structure 150 covering both sidewalls of each of the plurality of bit line structures 140, and the plurality of insulation fences 180 as the etch mask through an anisotropic etching process, and further removing another portion of the active region 118 through an isotropic etching process, so that the space defined by the active region 118 is expanded.

Referring to FIGS. 14A to 14D together, a plurality of buried contacts 170 may be formed in the plurality of buried contact holes 170H. The plurality of buried contacts 170 and the plurality of insulating fences 180 may be alternately arranged, while extending along between pairs of insulating spacer structures 150 facing each other among the plurality of insulating spacer structures 150 that cover both sidewalls of the plurality of bit line structures 140, that is, in the second horizontal direction (the Y direction). For example, the plurality of buried contacts 170 may include polysilicon.

In some example embodiments, the plurality of buried contacts 170 may be arranged in a line, e.g. may be arranged collinearly, in the first horizontal direction (the X direction) and the second horizontal direction (the Y direction). Each of the plurality of buried contacts 170 may extend in the vertical direction (the Z direction) perpendicular to the substrate 110 from the active region 118. The plurality of buried contacts 170 may constitute the plurality of buried contacts BC illustrated in FIG. 11B.

The plurality of buried contacts 170 may be disposed within the plurality of buried contact holes 170H, which are spaces defined by the plurality of insulating fences 180 and the plurality of insulating spacer structures 150 covering both sidewalls of the plurality of bit line structures 140. The plurality of buried contacts 170 may fill portions of lower parts of spaces between the plurality of insulating fences 180 and the plurality of insulating spacer structures 150 covering both sidewalls of each of the plurality of bit line structures 140.

A level of an upper surface of the plurality of buried contacts 170 may be located to be lower than the level of an upper surface of the plurality of insulating capping lines 148. An upper surface of the plurality of insulating fences 180 may be located at the same level in the vertical direction (the Z direction) as the upper surface of the plurality of insulating capping lines 148.

A plurality of landing pad holes 190H may be defined by the plurality of buried contacts 170, the plurality of insulating spacer structures 150, and the plurality of insulating fences 180. The plurality of buried contacts 170 may be exposed on bottom surfaces of the plurality of landing pad holes 190H.

In the process of forming the plurality of buried contacts 170, portions of upper parts of the insulating capping line 148 included the bit line structure 140 and the insulating spacer structure 150 may be removed, and therefore, the level of the upper surface of bit line structures 140 may be lowered.

Referring to FIGS. 15A to 15D together, after filling the plurality of landing pad holes 190H and forming a landing pad material layer covering the plurality of bit line structures 140, a recess portion 190R may be formed by removing a portion of the landing pad material layer. A plurality of landing pads 190 separated by the recess portion 190R may be formed. The plurality of landing pads 190 may fill at least a portion of the plurality of landing pad holes 190H and may extend onto the plurality of bit line structures 140.

In some example embodiments, the landing pad material layer may include a conductive barrier film and a conductive pad material layer on the conductive barrier film. For example, the conductive barrier film may include metal, conductive metal nitride, or a combination thereof. In some example embodiments, the conductive barrier film may include a Ti/TiN stacked structure. In some example embodiments, the conductive pad material layer may comprise tungsten (W).

In some example embodiments, a metal silicide film may be formed on the plurality of buried contacts 170 prior to forming the landing pad material layer. The metal silicide film may be between the plurality of buried contacts 170 and the landing pad material layer. The metal silicide film may include at least one of cobalt silicide ($CoSi_x$), nickel silicide ($NiSi_x$), or manganese silicide ($MnSi_x$), but is not limited thereto.

The plurality of landing pads 190 may be spaced apart from each other with the recess portion 190R therebetween. The plurality of landing pads 190 may be disposed on the plurality of buried contacts 170 and extend onto the plurality of bit line structures 140. In some example embodiments, the plurality of landing pads 190 may extend onto the plurality of bit lines 147. The plurality of landing pads 190 may be disposed on the plurality of buried contacts 170, and thus the plurality of buried contacts 170 may be electrically connected to the plurality of landing pads 190. The plurality of landing pads 190 may be connected to the active region 118 via the plurality of buried contacts 170. The plurality of landing pads 190 may constitute a plurality of landing pads LP illustrated in FIG. 11B. The buried contact 170 may be between two adjacent bit line structures 140, and the landing pad 190 may extend from between the two adjacent bit line structures 140 with the buried contact 170 therebetween, to one bit line structure 140.

The recess portion 190R may be filled with an insulating structure 195. In some example embodiments, the insulating structure 195 may include an interlayer insulating layer and an etch stop film. For example, the interlayer insulating layer may include oxide, and the etch stop film may include nitride. In FIGS. 15A and 15C, an upper surface of the insulating structure 195 is positioned at the same level as an upper surface of the plurality of landing pads 190, but is not limited thereto. For example, the insulating structure 195 may fill the recess portion 190R and cover the upper surface of the plurality of landing pads 190, and therefore, have the upper surface located at a higher level than the upper surface of the plurality of landing pads 190. In FIGS. 15A and 15C, the upper surface of the insulating structure 195 is positioned at the same level as a lower surface of a lower electrode 210, but is not limited thereto.

The plurality of lower electrodes 210, capacitor dielectric layers 220, and upper electrodes 230 may sequentially formed on the plurality of landing pads 190. The plurality of lower electrodes 210, the capacitor dielectric layers 220, and the upper electrodes 230 may constitute a plurality of capacitor structures 200. Each of the plurality of lower electrodes 210 may be electrically connected correspondingly to each of the plurality of landing pads 190. The capacitor dielectric layer 220 may conformally cover the surfaces of the plurality of lower electrodes 210. In some example embodiments, the capacitor dielectric layer 220 may be integrally formed to cover the plurality of lower electrodes 210 together within a constant region, for example, one memory cell region (CR of FIG. 11B). In some example embodiments, the capacitor dielectric layer 220 may be formed to cover the memory cell region CR and the peripheral region (PR of FIG. 11B) together. The plurality of lower electrodes 210 may constitute a plurality of storage nodes SN illustrated in FIG. 11B. In some example embodiments, the capacitor dielectric layer 220 may not be formed in the peripheral region PR.

Each of the plurality of lower electrodes 210 may be a column shape filled inside to have a circular horizontal cross section, that is, a pillar shape, but is not limited thereto. In some example embodiments, each of the plurality of lower electrodes 210 may be a cylinder shape closed in a lower portion. In some example embodiments, the plurality of lower electrodes 210 may be arranged in a honeycomb shape that is arranged in a zigzag manner in the first horizontal direction (the X direction) or the second horizontal direction (the Y direction). In some other embodiments, the plurality of lower electrodes 210 may be arranged in a matrix form that is arranged in lines in each of the first horizontal direction (the X direction) and the second horizontal direction (the Y direction). The plurality of lower electrodes 210 may include, for example, silicon doped with impurities, metal such as tungsten or copper, or conductive metal compound such as titanium nitride. Although not shown separately, the semiconductor memory device 1 may further include at least one support pattern that contacts the sidewalls of the plurality of lower electrodes 210.

The capacitor dielectric layer 220 may include, for example, TaO, TaAlO, TaON, ALO, AlSiO, HfO, HfSiO, ZrO, ZrSiO, TiO, TiAlO, BST((Ba,Sr)TiO), STO(SrTiO), BTO(BaTiO), PZT(Pb(Zr,Ti)O), (Pb,La)(Zr,Ti)O, Ba(Zr,Ti)O, Sr(Zr,Ti)O, or combinations thereof.

The upper electrode 230 may include one of a doped semiconductor material layer, a main electrode layer, and an interfacial layer, or a stacked structure of at least two of the above. The doped semiconductor material layer may include at least one of doped polysilicon and doped polycrystalline silicon germanium. The main electrode layer may be made of or include metal material. The main electrode layer may include, for example, at least one of W, Ru, RuO, Pt, PtO, Jr, IrO, SRO (SrRuO), BSRO((Ba,Sr)RuO), CRO(CaRuO), BaRuO, La(Sr,Co)O, and the like. In some example embodiments, the main electrode layer may be made of W. The interfacial layer may include at least one of metal oxide, metal nitride, metal carbide, and metal silicide.

Referring to FIG. 15E together with FIGS. 15A to 15D, at least one gate line structure 140P may be formed on a logic active region 117. The gate line structure 140p may include a gate line 147P disposed in the peripheral region PR and the insulating capping line 148 covering one gate line 147P. The gate line 147P may include the first metal-based conductive pattern 145 and the second metal-based conductive pattern 146 to be disposed in the peripheral region PR. A gate insulating film pattern 142 may be between the gate line 147P and the logic active region 117. In some example embodiments, the gate line structure 140P may further include the conductive semiconductor pattern 132 between the gate insulating film pattern 142 and the first metal-based conductive pattern 145.

The conductive semiconductor pattern 132, the first metal-based conductive pattern 145, and the second metal-based conductive pattern 146, which are included in the gate line 147P, may be formed together with the conductive semiconductor pattern 132, the first metal-based conductive pattern 145, and the second metal conductive pattern 146, which are included in the bit line structure 140 described in FIGS. 13A to 13D.

In some example embodiments, the gate insulating film pattern 142 may include a stacked structure of at least two layers among a low dielectric material layer, an interfacial insulating layer, and a high dielectric material layer. For example, the gate insulating film pattern 142 may include the stacked structure of the low dielectric material layer and the high dielectric material layer, or the stacked structure of the interfacial insulating layer and the high dielectric material layer. The low dielectric material layer may have a lower dielectric constant than the high dielectric material layer and may be thicker than the high dielectric material layer. The interfacial insulating layer may have the lower dielectric constant than the high dielectric material layer and may be thinner than the high dielectric material layer.

For example, the low dielectric material layer may include silicon oxide. In some example embodiments, the low dielectric material layer may include plasma nitriding-treated silicon oxide, that is, plasma nitride oxide (PNO). In some example embodiments, the low dielectric material layer may have a thickness of from about 60 Å to about 150 Å.

For example, the interfacial insulating layer may include silicon oxide. In some example embodiments, the interfacial insulating layer may include silicon oxide formed by thermal oxidation. In some example embodiments, the interfacial insulating layer may have a thickness of about 5 Å (0.5 nm) to about 20 Å (2.0 nm).

For example, the high electric material layer may include at least one selected from silicon nitride, silicon oxynitride, or high dielectric material having a higher dielectric constant than silicon oxide. In some example embodiments, the high dielectric material layer may include at least one material selected from hafnium oxide (HfO), hafnium silicate (HfSiO), hafnium oxynitride (HfON), hafnium silicon oxynitride (HfSiON), rantanium oxide (LaO), rantanium aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (ALO), or lead scandium tantalum oxide (PbScTaO). In some example embodiments, the high dielectric material layer may have a thickness of from about 10 Å (1.0 nm) to about 40 Å (4.0 nm).

A sidewall of the gate line structure 140P may be covered with the gate insulating spacer 150P. The gate insulating spacer 150P may include, for example, a nitride film. In some example embodiments, the gate insulating spacer 150P may include a single layer, but is not limited thereto, and may include a plurality of stacked structures of two or more layers. In some example embodiments, all or part of the gate insulating spacer 150P may be formed together with all or part of the insulating spacer structure 150 with the same material.

Filling insulating layers 172, 174, and 176 may be formed around the plurality of gate line structures 140P. The filling insulating layers 172, 174, and 176 may cover the logic device isolation film 115. In some example embodiments, the filling insulating layers 172, 174, and 176 may include a stacked structure of the first filling insulating layer 172, the second filling insulating layer 174, and the third filling insulating layer 176. The first filling insulating layer 172 may conformally cover the logic device isolation film 115 and the insulating spacer structure 150. In some example embodiments, the first filling insulating layer 172 may be nitride, the second filling insulating layer 174 may be oxide, and the third filling insulating layer 176 may be nitride. In some example embodiments, an upper surface of the second filling insulating layer 174 may be located at the same level as the upper surface of the bit line structure 140. In some example embodiments, an upper surface of the third filling insulating layer 176 may be located at the same level as the upper surface of the gate line structure 140P.

A buried insulating layer 250 may be filled in the peripheral circuit region PR corresponding to the level at which the plurality of capacitor structure 200 is located. The buried insulating layer 250 may include, for example, an oxide film or an ultra low K (ULK) film. The oxide film may include any one film selected from a borophosilicate glass (BPSG) film, a phosphosilicate glass (PSG) film, a borosilicate glass (BSG) film, an un-doped silicate glass (USG) film, a tetra ethyleorthosilicate (TEOS) film, or a high density plasma (HDP) film. The ULK film may include, for example, any one film selected from a SiOC film and a SiCoH film, having an ultra low dielectric constant K of 2.2 to 2.4.

Each of the plurality of lower electrodes 210 may be a column shape filled inside to have a circular horizontal cross section, that is, a pillar shape, but is not limited thereto. In some example embodiments, each of the plurality of lower electrodes 210 may be a cylinder shape closed in a lower portion. In some example embodiments, the plurality of lower electrodes 210 may be arranged in a honeycomb shape that is arranged in a zigzag manner in the first horizontal direction (the X direction) or the second horizontal direction (the Y direction). In some other embodiments, the plurality of lower electrodes 210 may be arranged in a matrix form that is arranged in lines in each of the first horizontal direction (the X direction) and the second horizontal direction (the Y direction). The plurality of lower electrodes 210 may include, for example, silicon doped with impurities such as at least one of boron, carbon, phosphorus, or arsenic, metal such as tungsten and/or copper, or conductive metal compound such as titanium nitride. Although not shown separately, the semiconductor memory device 1 may further include at least one support pattern that contacts the sidewalls of the plurality of lower electrodes 210.

The capacitor dielectric layer 220 may include, for example, TaO, TaAlO, TaON, ALO, AlSiO, HfO, HfSiO, ZrO, ZrSiO, TiO, TiAlO, BST((Ba,Sr)TiO), STO(SrTiO), BTO(BaTiO), PZT(Pb(Zr,Ti)O), (Pb,La)(Zr,Ti)O, Ba(Zr,Ti)O, Sr(Zr,Ti)O, or combinations thereof.

The upper electrode 230 may include one of a doped semiconductor material layer, a main electrode layer, and an interfacial layer, or a stacked structure of at least two of the above. The doped semiconductor material layer may include at least one of doped polysilicon and doped polycrystalline silicon germanium. The main electrode layer may be made of metal material. The main electrode layer may include, for example, W, Ru, RuO, Pt, PtO, Jr, IrO, SRO (SrRuO), BSRO((Ba,Sr)RuO), CRO(CaRuO), BaRuO, La(Sr,Co)O, and the like. In some example embodiments, the main electrode layer may be made of W. The interfacial layer may include at least one of metal oxide, metal nitride, metal carbide, and metal silicide.

In the memory cell region CR, the active region 118, the word line 120, the gate dielectric film 122, the bit line 147, the buried contact 170, the landing pad 180, and the capacitor structure 200 may constitute a memory cell. In the dummy cell region DR, the dummy active region 119, the word line 120, the gate dielectric film 122, the bit line 147, the buried contact 170, the landing pad 180, and the capacitor structure 200 may constitute a dummy memory cell.

The semiconductor memory device 1 may include the plurality of active regions 118 defined by the device isolation film 116 in the memory cell region CR, the plurality of dummy active regions 119 defined by the device isolation film 116 in the dummy cell region DR, and the at least one logic active region 117 defined by the logic device isolation film 115 in the peripheral region PR. At least two of the plurality of dummy active regions 119 may be disposed in the first horizontal direction (the X direction) between the plurality of active regions 118 and the logic device isolation film 115.

As described in FIGS. 7A to 10, the width and/or the pitch of the plurality of dummy active regions 119 may have values greater than the width and/or the pitch of the plurality of active regions 118, and therefore, when in the process of forming the device isolation structure DS composed of the device isolation film 116 and the logic device isolation film 115, shrinkage occurs in the material that forms the device isolation structure DS, the plurality of dummy active regions 119 may function as the dam that prevents or reduces the likelihood and/or impact of warpage in the plurality of active regions 118 from being occurred.

Alternatively or additionally, the dummy cell region DR where the plurality of dummy active regions 119 is disposed may be arranged to surround the memory cell region CR where the plurality of active regions 118 is disposed. The plurality of word lines WL, the plurality of bit lines BL, the plurality of buried contacts BC, the plurality of landing pads LP, and the plurality of storage nodes SN may be disposed in a constant array, on the plurality of active region 118 and the plurality of dummy active region 119, as illustrated in FIG. 11B. Thus, the plurality of dummy active regions 119 disposed in the dummy cell region DR, and the word lines WL, the bit lines BL, the buried contacts BC, the landing pads LP and the storage nodes SN that are disposed on the plurality of dummy active regions 119 may constitute the plurality of dummy memory cell, wherein the plurality of dummy memory cell may allow the plurality of active regions 118 disposed in the memory cell region CR, and the word lines WL, the bit lines BL, the buried contacts BC, the landing pads LP and the storage nodes SN that are disposed on the plurality of active regions 118 that constitute the plurality of memory cell to be formed with generally uniform shape and arrangement.

In the semiconductor memory device 1 according to inventive concepts, the plurality of dummy active regions 119 may perform the functions of the dam and the dummy pattern, and thus, there may not be a need or may be a reduced need to form separately a component that performs the function of the dam and a component that performs the function of the dummy pattern. Therefore, in the semiconductor memory device 1 according to inventive concepts, the ratio of the area occupied by the memory cell region CR in which the plurality of memory cells is disposed may increase, and thus, the number of memory cells of the semiconductor memory device 1 increases to achieve substantially enhanced integration.

While inventive concepts has been particularly shown and described with reference to some example embodiments thereof, it will be understood that various changes in form and details may be made therein without departing from the spirit and scope of the following claims.

What is claimed is:

1. A semiconductor memory device, comprising:
a substrate comprising a memory cell region and a dummy cell region surrounding the memory cell region, the memory cell region including a plurality of memory cells;
a plurality of active regions in the memory cell region, each of the plurality of active regions extending in a long axis direction, the long axis direction being a diagonal direction with respect to a first horizontal direction and a second horizontal direction orthogonal to the first horizontal direction, each of the plurality of active regions having a first width in a short axis direction orthogonal to the long axis direction; and
a plurality of dummy active regions in the dummy cell region, each of the plurality of dummy active regions extending in the long axis direction, each of the plurality of dummy active regions having a second maximum width greater than a first maximum width in the short axis direction.

2. The semiconductor memory device of claim 1, wherein at least one of the plurality of dummy active regions defines a plurality of sidewall recesses on sidewalls of the plurality of dummy active regions.

3. The semiconductor memory device of claim 2, wherein the plurality of active regions are apart from each other at a first interval in the long axis direction and each extend in the long axis direction with a first length.

4. The semiconductor memory device of claim 3, wherein the plurality of sidewall recesses are on the sidewalls of the at least one of the plurality of dummy active regions apart from each other with a second length in the long axis direction, and
the plurality of sidewall recesses have a first value of a second interval in the long axis direction.

5. The semiconductor memory device of claim 4, wherein a sum of the first length and the first interval is substantially the same as a sum of the second length and the second interval.

6. The semiconductor memory device of claim 2, wherein the plurality of sidewall recesses are on all of the sidewalls of the plurality of dummy active regions.

7. The semiconductor memory device of claim 2, wherein the plurality of sidewall recesses are at sidewalls of a portion adjacent to the plurality of active regions among the plurality of dummy active regions, and
the plurality of sidewall recesses are not at sidewalls of a portion not adjacent to the plurality of active regions.

8. The semiconductor memory device of claim 2, further comprising:
a device isolation structure defining the plurality of active regions and the plurality of dummy active regions,
wherein portions of the device isolation structure between two active regions adjacent to each other in the long axis direction among the plurality of active regions and the plurality of sidewall recesses are collinear along a plurality of horizontal lines arranged at equal intervals in the second horizontal direction.

9. The semiconductor memory device of claim 1, wherein the plurality of active regions repeat with a first pitch in the short axis direction, and
the plurality of dummy active regions repeat with a second pitch greater than the first pitch in the short axis direction.

10. The semiconductor memory device of claim 9, wherein a ratio of the second maximum width to the first maximum width is greater than a ratio of the second pitch to the first pitch.

11. A semiconductor memory device, comprising:
a substrate comprising a memory cell region, a peripheral region and a dummy cell region between the memory cell region and the peripheral region, the memory cell region including a plurality of memory cells, the dummy cell region including a plurality of dummy memory cells;
a plurality of active regions in the memory cell region, each of the plurality of active regions extending in a long axis direction, the long axis direction being a diagonal direction with respect to a first horizontal direction and a second horizontal direction orthogonal to the first horizontal direction, each of the plurality of active regions having a first width in a short axis direction, and the plurality of active regions repeat with a first pitch in the short axis direction, the short axis direction orthogonal to the long axis direction;
at least one logic active region in the peripheral region; and
a plurality of dummy active regions in the dummy cell region, each of the plurality of dummy active regions extending in the long axis direction, each of the plurality of dummy active regions having a second width greater than the first width, and the plurality of dummy active regions repeat with a second pitch twice the first pitch, the second width and the second pitch in the short axis direction, wherein
at least one of the plurality of dummy active regions defines a plurality of sidewall recesses on sidewalls of the at least one of the plurality of dummy active regions.

12. The semiconductor memory device of claim 11, further comprising:
a plurality of word lines extending parallel to each other in the first horizontal direction across the plurality of active regions and the plurality of dummy active regions; and a plurality of bit lines extending parallel to each other in the second horizontal direction, the plurality of bit lines on the substrate, wherein at least two of the plurality of dummy active regions are arranged in the first horizontal direction between the memory cell region and the peripheral region.

13. The semiconductor memory device of claim 11, wherein the plurality of active regions are apart from each other at a first interval in the long axis direction, each of the plurality of active regions extending in the long axis direction and having a first length, the plurality of sidewall recesses are on the sidewalls of the at least one of the plurality of dummy active regions apart from each other and having a second length in the long axis direction, the plurality of sidewall recesses having a first value of a second interval in the long axis direction, and a sum of the first length and the first interval is substantially the same as a sum of the second length and the second interval.

14. The semiconductor memory device of claim 13, wherein the first length is the same as the second length, and the first interval is the same as the second interval.

15. The semiconductor memory device of claim 11, further comprising:

a device isolation structure defining the plurality of active regions, the plurality of dummy active regions, and the at least one logic active region, wherein portions of the device isolation structure between two active regions adjacent to each other in the long axis direction among the plurality of active regions and the plurality of sidewall recesses are arranged in a honeycomb.

16. The semiconductor memory device of claim 15, wherein the device isolation structure fills the plurality of sidewall recesses.

17. The semiconductor memory device of claim 11, wherein the plurality of sidewall recesses are at the sidewalls of a portion adjacent to the plurality of active regions among the plurality of dummy active regions, and are not at the sidewalls of a portion adjacent to the at least one logic active region.

18. A semiconductor memory device, comprising:

a substrate comprising a memory cell region, a peripheral region, and a dummy cell region between the memory cell region and the peripheral region;

a plurality of active regions in the memory cell region, each of the plurality of active regions extending in a long axis direction, the long axis direction being a diagonal direction with respect to a first horizontal direction and a second horizontal direction orthogonal to the first horizontal direction, each of the plurality of active regions having a first width, and the plurality of active regions repeat with a first pitch, the first width and the first pitch in a short axis direction orthogonal to the long axis direction;

at least one logic active region disposed in the peripheral region;

a plurality of dummy active regions in the dummy cell region, each of the plurality of dummy active regions extending in the long axis direction, each of the plurality of dummy active regions having a second width greater than the first width, and the plurality of dummy active regions repeat with a second pitch greater than the first pitch, the first width and the second width in the short axis direction;

a device isolation structure defining the plurality of active regions, the at least one logic active region, and the plurality of dummy active regions;

a plurality of word lines extending parallel to each other in the first horizontal direction across the plurality of active regions and the plurality of dummy active regions;

a plurality of bit lines that extending parallel to each other in the second horizontal direction, the plurality of bit lines on the substrate;

a plurality of buried contacts filling a lower portion of a space between the plurality of bit lines on the substrate;

a plurality of landing pads filling an upper portion of the space between the plurality of bit lines and extending onto the plurality of bit lines; and a plurality of capacitors connected to the plurality of landing pads, wherein at least one of the plurality of dummy active regions defines a plurality of sidewall recesses filled with the device isolation structure on sidewalls of the at least one of the plurality of dummy active regions.

19. The semiconductor memory device of claim 18, wherein the second pitch is twice the first pitch, and a ratio of the second width to the first width is greater than a ratio of the second pitch to the first pitch.

20. The semiconductor memory device of claim 18, wherein the first pitch is 0.1 µm to 1 µm, and the second pitch is 0.2 µm to 2 µm.

* * * * *